(12) United States Patent
Kim et al.

(10) Patent No.: US 12,439,775 B2
(45) Date of Patent: Oct. 7, 2025

(54) DISPLAY DEVICE

(71) Applicant: LG DISPLAY CO., LTD., Seoul (KR)

(72) Inventors: Seongkwang Kim, Gyeonggi-do (KR); Dojin Kim, Seoul (KR)

(73) Assignee: LG Display Co., Ltd. (KR)

(*) Notice: Subject to any disclaimer, the term of this patent is extended or adjusted under 35 U.S.C. 154(b) by 471 days.

(21) Appl. No.: 17/978,776

(22) Filed: Nov. 1, 2022

(65) Prior Publication Data

US 2023/0171999 A1 Jun. 1, 2023

(30) Foreign Application Priority Data

Nov. 29, 2021 (KR) .................. 10-2021-0166849

(51) Int. Cl.
| | |
|---|---|
| *H01L 27/32* | (2006.01) |
| *H10D 86/40* | (2025.01) |
| *H10D 86/60* | (2025.01) |
| *H10K 59/121* | (2023.01) |
| *H10K 59/131* | (2023.01) |
| *H10K 59/35* | (2023.01) |

(52) U.S. Cl.
CPC ....... *H10K 59/1213* (2023.02); *H10D 86/441* (2025.01); *H10D 86/481* (2025.01); *H10D 86/60* (2025.01); *H10K 59/1216* (2023.02); *H10K 59/131* (2023.02); *H10K 59/351* (2023.02); *H10K 59/353* (2023.02)

(58) Field of Classification Search
None
See application file for complete search history.

(56) References Cited

U.S. PATENT DOCUMENTS

| | | | |
|---|---|---|---|
| 9,460,656 B2 | 10/2016 | Shim et al. | |
| 11,990,579 B2 | 5/2024 | Kim et al. | |
| 2020/0403131 A1* | 12/2020 | Kim | H10H 20/01 |

FOREIGN PATENT DOCUMENTS

| | | |
|---|---|---|
| KR | 10-2015-0066971 A | 6/2015 |
| KR | 10-2020-0145966 A | 12/2020 |
| KR | 10-2021-0036685 A | 4/2021 |
| KR | 10-2021-0083052 A | 7/2021 |
| KR | 10-2021-0085202 A | 7/2021 |

OTHER PUBLICATIONS

Korean Notice of Allowance dated Sep. 30, 2024 issued in Patent Application No. 10-2021-0166849 w/English Translation (3 pages).

* cited by examiner

*Primary Examiner* — William C Trapanese
(74) *Attorney, Agent, or Firm* — Fish & Richardson P.C.

(57) ABSTRACT

A display device includes data lines are disposed on or over a substrate in a first direction, a first scan line extends through a first subpixel in a second direction, a first auxiliary pattern is disposed in the first subpixel in the second direction and electrically connected to the first scan line through one or more first contact holes in an interlayer insulating film, the first scan line includes a first line portion and a wider first contact portion, the first auxiliary pattern includes a first line pattern portion and a wider first seating pattern portion, the first contact portion is connected to the first seating pattern portion through the one or more first contact holes, the first contact portion is symmetrical with respect to a central axis of the first line portion, and the first seating pattern portion is symmetrical with respect to a central axis of the first line pattern portion.

20 Claims, 20 Drawing Sheets

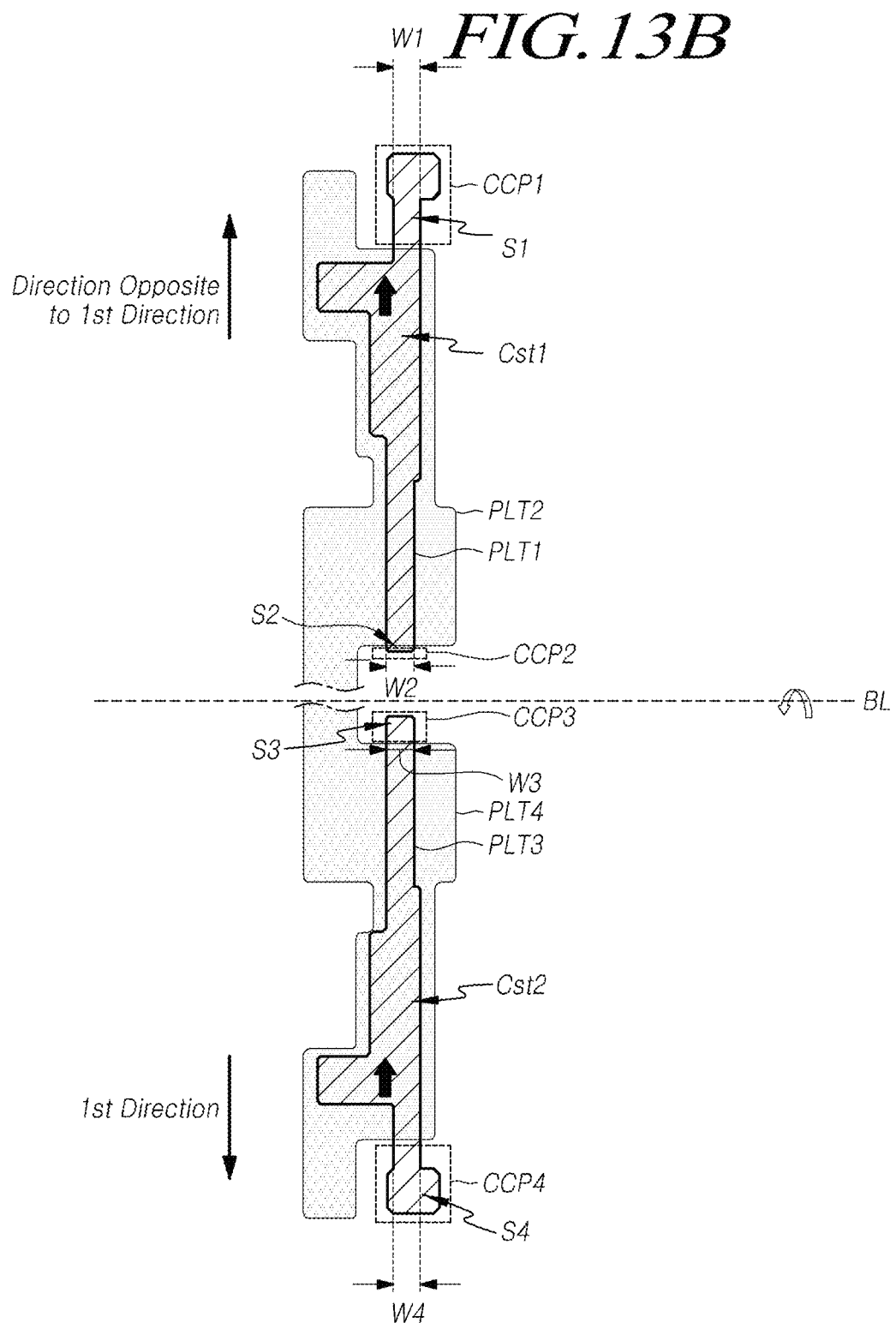

DISPLAY DEVICE

CROSS-REFERENCE TO RELATED APPLICATION

This application claims the priority of Korean Patent Application No. 10-2021-0166849, filed on Nov. 29, 2021, which is hereby incorporated by reference in its entirety.

BACKGROUND

Field of the Disclosure

The present disclosure relates to a display device.

Description of the Background

In fabrication of display panels, a process deviation may occur for a variety of reasons, and thus signal lines, patterns, electrodes, or the like may be patterned in positions shifted from intended positions. As the patterning positions are shifted due to the process deviation, the overlay between metals to be in contact with each other may be misaligned, thereby causing an adverse effect to electrical connection of the metals.

In addition, in fabrication of display panels, defects, such as a brightened point or a darkened point, may occur in a subpixel due to a variety of reasons, such as an impurity present in a variety of positions of the subpixel. For example, in a process of forming a driving transistor in each subpixel, minute process-induced matter may be formed in the driving transistor. When the driving transistor has an impurity in this manner, a short between nodes may be caused by the impurity, and abnormal current having a significantly large magnitude may flow through the driving transistor. Due to such a phenomenon, an abnormally bright point may be formed in the subpixel, thereby causing the subpixel to be defective.

In the field of display technology, when signal lines, patterns, electrodes, or the like are patterned in positions shifted from intended positions due to a process deviation in the fabrication of a panel, the overlay between metals to be in contact with each other may be misaligned, thereby causing a problem in electrical connection between the metals.

In this regard, a reliable contact structure for a display device is required even in the case in which a process deviation occurs in the fabrication of a display panel.

In particular, when the overlay between metals (e.g., scan lines or auxiliary patterns in contact with each other is misaligned, parasitic capacitance of two adjacent subpixels having a flip structure (i.e., a symmetric structure) may be changed, thereby causing luminance deviation between the two subpixels having the flip structure (i.e., the symmetric structure).

The above information disclosed in this Background section is only for enhancement of understanding of the background of the described technology and therefore it may contain information that does not form prior art that is already known to a person of ordinary skill in the art.

SUMMARY

Accordingly, the present disclosure is to provide a display device having a reliable electrical connection between metals and preventing a luminance deviation between two subpixels among a plurality of subpixels having a flip structure (i.e., a symmetric structure) even in the case in which the overlay between metals (e.g., scan lines or auxiliary patterns) to be in contact with each other is misaligned.

The present disclosure is also provide a display device having a scan line structure suitable for a situation in which subpixels have a flip structure, as well as a scan line structure that does not cause a luminance deviation even in the case in which a process deviation has occurred.

The present disclosure is also to provide a display device having a storage capacity structure suitable for a situation in which subpixels have a flip structure and a scan line structure that does not cause a storage capacitance deviation even in the case in which a process deviation has occurred.

According to various aspects of the present disclosure, a display device includes a substrate; data lines disposed on or over the substrate in a first direction, a first scan line extending through a first subpixel among a plurality of subpixels and disposed in a second direction intersecting the first direction, a first auxiliary pattern disposed in an area of the first subpixel in the second direction and electrically connected to the first scan line through one or more first contact holes; and an interlayer insulating film positioned between the first scan line and the first auxiliary pattern and having the one or more first contact holes.

The first scan line may include a first line portion having a first width in the first direction and a first contact portion having a second width in the first direction, the second width being wider than the first width. The first auxiliary pattern may include a first line pattern portion having a third width in the first direction and a first seating pattern portion having a fourth width in the first direction, the fourth width being wider than the third width. The first contact portion of the first scan line may be connected to the first seating pattern portion of the first auxiliary pattern through the one or more first contact holes.

The first contact portion of the first scan line may be symmetrical with respect to a central axis of the first line portion of the first scan line in the second direction. The first seating pattern portion of the first auxiliary pattern may be symmetrical with respect to a central axis of the first line pattern portion in the second direction.

The display device may further include a second scan line disposed in the second direction and adjacent to the first scan line in the first direction; and a second auxiliary pattern disposed in the second direction in an area of a second subpixel among the plurality of subpixels adjacent to the first subpixel in the first direction and electrically connected to the second scan line through one or more second contact holes. The interlayer insulating film may be symmetrical with respect to a central axis of the first line portion of positioned between the second scan line and the second auxiliary pattern.

The second scan line may include a second line portion having the first width in the first direction and a second contact portion having the second width in the first direction. The second auxiliary pattern may include a second line pattern portion having the third width in the first direction and a second seating pattern portion having the fourth width in the first direction. The second contact portion of the second scan line may be connected to the second seating pattern portion of the first auxiliary pattern through the one or more second contact holes.

The second contact portion of the second scan line may be symmetrical with respect to a central line of the second line portion of the second scan line in the second direction. The second seating pattern portion of the second auxiliary pattern may be symmetrical with respect to a central line of the second line pattern portion of the second auxiliary pattern in the second direction.

According to various aspects of the present disclosure, a display device includes a substrate; a first scan line disposed on or over the substrate and extending through a first subpixel among a plurality of subpixels, a first auxiliary pattern disposed in an area of the first subpixel and electrically connected to the first scan line through one or more first contact holes, and an interlayer insulating film positioned between the first scan line and the first auxiliary pattern and having the one or more first contact holes.

The first scan line may protrude in a top-bottom direction to be symmetrical with respect to a longitudinal axis. The first auxiliary pattern may protrude in the top-bottom direction to be symmetrical with respect to a longitudinal axis.

In the present disclosure, the display device may have a scan line structure suitable for a situation in which subpixels have a flip structure, as well as a scan line structure that does not cause a luminance deviation even in the case in which a process deviation has occurred.

In the present disclosure, the display device may have a storage capacity structure suitable for a situation in which subpixels have a flip structure and a scan line structure that does not cause a storage capacitance deviation even in the case in which a process deviation has occurred.

In the present disclosure, the display device may have a repair structure that does not cause a decrease in the aperture ratio and does not occupy a large space, as well as a subpixel flip structure for the repair structure.

BRIEF DESCRIPTION OF THE DRAWINGS

The above and other features and advantages of the present disclosure will be more clearly understood from the following detailed description, taken in conjunction with the accompanying drawings, in which:

FIGS. 12, 13A, and 13B illustrate first and second storage capacitor structures suitable for the flip structure between the first subpixel and the second subpixel in the display device according to the present disclosure;

DETAILED DESCRIPTION

Figure 1:
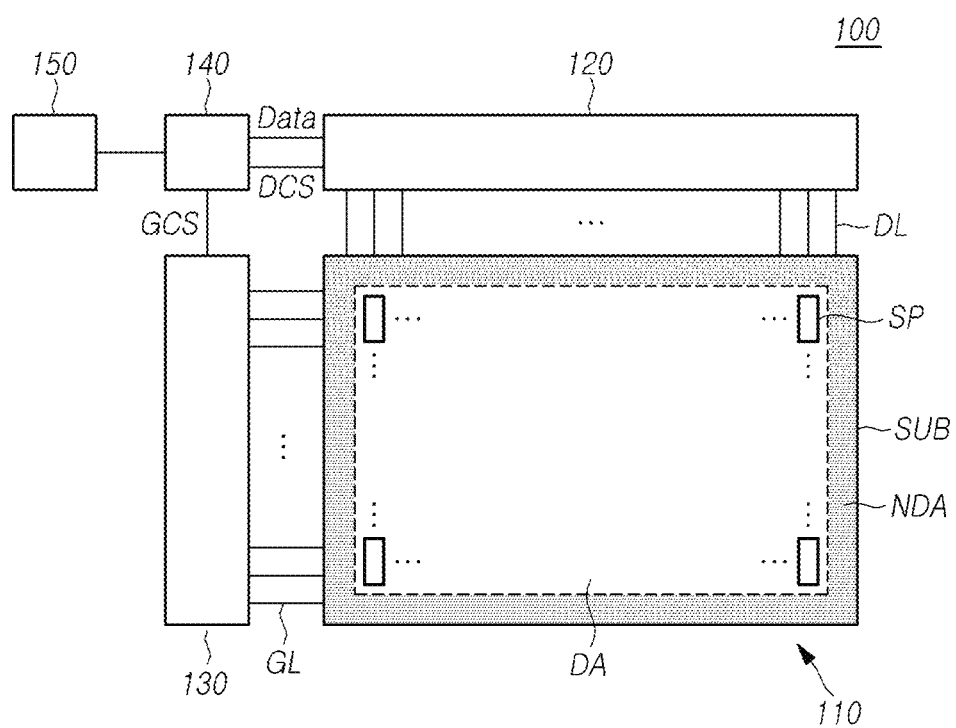
FIG. 1 is a diagram illustrating a system configuration of a display device according to the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting", "made up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlap withs" etc. a second element, it should be interpreted that, not only can the first element "be directly connected or coupled to" or "directly contact or overlap with" the second element, but a third element can also be "interposed" between the first and second elements, or the first and second elements can "be connected or coupled to", "contact or overlap with", etc. each other via a fourth element. Here, the second element may be included in at least one of two or more elements that "are connected or coupled to", "contact or overlap with", etc. each other.

Hereinafter, a variety of aspects will be described in detail with reference to the accompanying drawings.

FIG. 1 is a diagram illustrating a system configuration of a display device 100 according to the present disclosure. Referring to FIG. 1, a display driving system of the display device 100 may include a display panel 110 and a display driver circuit driving the display panel 110.

The display panel 110 may include a display area DA on which images are displayed and a non-display area NDA on which images are not displayed. The display panel 110 may include a plurality of subpixels SP disposed on a substrate SUB in order to display images. For example, the plurality of subpixels SP may be disposed in the display area DA. In some cases, at least one subpixel SP may be disposed in the non-display area NDA. The at least one subpixel SP disposed in the non-display area NDA will also be referred to as a dummy subpixel.

The display panel 110 may include a plurality of signal lines disposed on or over the substrate SUB to drive the plurality of subpixels SP. For example, the plurality of signal lines may include data lines DL, gate lines GL, drive voltage lines, and the like.

The plurality of data lines DL may intersect the plurality of gate lines GL. Each of the plurality of data lines DL may be arranged to extend in a first direction. Each of the plurality of gate lines GL may be arranged to extend in a direction intersecting the first direction. Here, the first direction may be a column direction, whereas a direction intersecting the first direction may be a row direction.

The display driver circuit may include a data driver circuit 120 and a gate driver circuit 130, and also include a controller 140 to control the data driver circuit 120 and the gate driver circuit 130. The data driver circuit 120 may output data signals (also referred to as data voltages) corresponding to image signals to the plurality of data lines DL. The gate driver circuit 130 may generate gate signals and output the gate signals to the plurality of gate lines GL. The controller 140 may convert image data input from an external host 150 into image data having a data signal format readable by the data driver circuit 120, and supply the image data to the data driver circuit 120.

The data driver circuit 120 may include one or more source driver integrated circuits (SDICs). For example, each of the SDICs may be connected to the display panel 110 by a tape-automated bonding (TAB) method, connected to a bonding pad of the display panel 110 by a chip-on-glass (COG) method or a chip-on-panel (COP) method, or implemented as a chip-on-film (COF) structure connected to the display panel 110.

The gate driver circuit 130 may be connected to the display panel 110 by a TAB method, connected to a bonding pad of the display panel 110 by a COG method or a COP method, connected to the display panel 110 by a COF method, or formed in the non-display area NDA of the display panel 110 by a gate-in-panel (GIP) method.

The display device 100 according to the present disclosure may be a self-emissive display device in which the display panel 110 emits light by itself. For example, the display device 100 may be an organic light-emitting display device in which the emitting device is implemented as an organic light-emitting diode (OLED). As another example, the display device 100 may be an inorganic light-emitting display device in which the emitting device is implemented as a light-emitting diode based on an inorganic material. As another example, the display device 100 may be a quantum dot display device in which the emitting device is implemented as a quantum dot that is a self-emissive semiconductor crystal.

Figure 2:
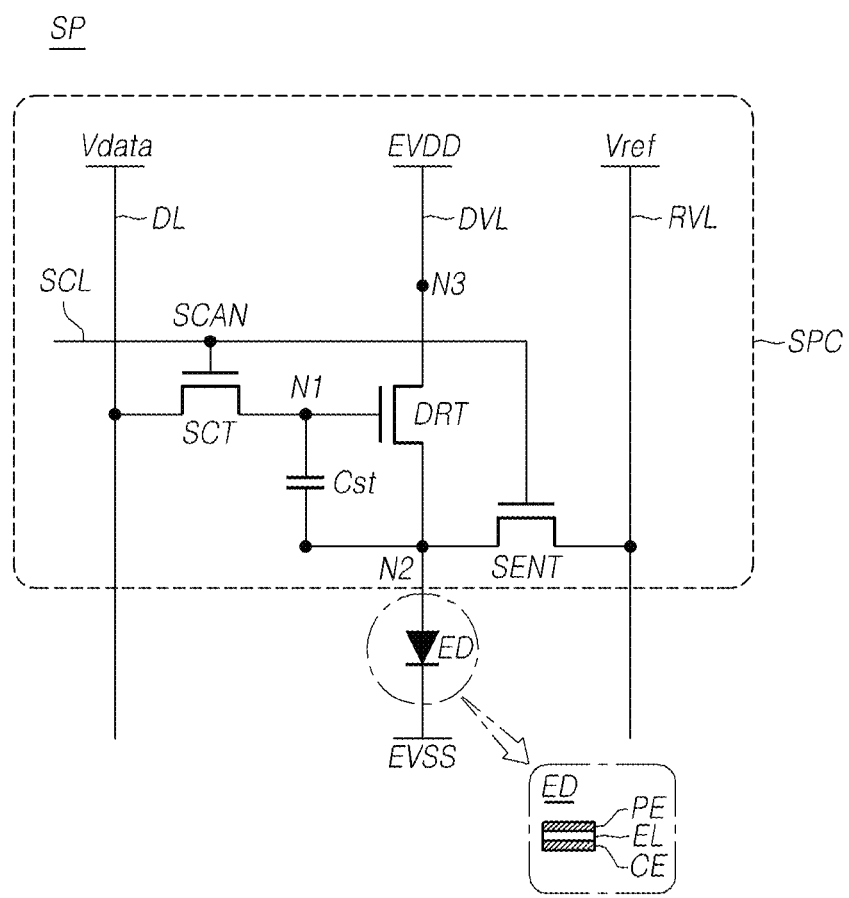
FIG. 2 illustrates an equivalent circuit of a subpixel in the display device according to the present disclosure.

FIG. 2 illustrates an equivalent circuit of a subpixel SP in the display device 100 according to aspects. Referring to FIG. 2, in the display device 100 according to the present disclosure, each of the subpixels SP may include an emitting device ED and a pixel driver circuit SPC driving the emitting device ED. The pixel driver circuit SPC may include a driving transistor DRT, a scan transistor SCT, and a storage capacitor Cst.

The driving transistor DRT may drive the emitting device ED by controlling a current flowing through the emitting device ED. The scan transistor SCT may transfer a data voltage Vdata to a first node N1 that is a gate node of the driving transistor DRT. The storage capacitor Cst may be configured to maintain a voltage for a predetermined time.

The emitting device ED may include a pixel electrode PE, a common electrode CE, and an emissive layer EL positioned between the pixel electrode PE and the common electrode CE. The pixel electrode PE may be an anode (or a cathode), and may be electrically connected to a second node N2 of the driving transistor DRT. The common electrode CE may be a cathode (or an anode), and a base voltage EVSS may be applied to the common electrode CE. The emitting device ED may be, for example, an emitting device, such as an organic light-emitting diode (OLED), a light-emitting diode (LED) based on an inorganic material, or a quantum dot emitting device.

The driving transistor DRT may be a transistor to drive the emitting device ED, and may include the first node N1, the second node N2, a third node N3, and the like. The first node N1 may be a gate node, and may be electrically connected to a source node or a drain node of the scan transistor SCT. The second node N2 may be a source node or a drain node, and may be electrically connected to the pixel electrode PE of the emitting device ED. The third node N3 may be a drain node or a source node, and may be electrically connected to a driving voltage line DVL through which a driving voltage EVDD is supplied. Hereinafter, for the sake of brevity, the second node N2 will be described as being a source node, whereas the third node N3 will be described as being a drain node.

The scan transistor SCT may switch the connection between a data line DL and the first node N1 of the driving transistor DRT. The scan transistor SCT may control the connection between the first node N1 of the driving transistor DRT and a corresponding data line DL among the plurality of data lines DL in response to a scan signal SCAN supplied through a scan line SCL, i.e., a type of gate line GL.

The drain node or the source node of the scan transistor SCT may be electrically connected to the corresponding data line DL. The source node or the drain node of the scan transistor SCT may be electrically connected to the first node N1 of the driving transistor DRT. The gate node of the scan transistor SCT may be electrically connected to the scan signal line SCL to receive the scan signal SCAN applied therethrough. The scan transistor SCT may be turned on by the scan signal SCAN having a turn-on level voltage to transfer the data voltage Vdata, supplied from the corresponding data line DL, to the first node N1 of the driving transistor DRT.

The storage capacitor Cst may be provided between the first node N1 and the second node N2 of the driving transistor DRT.

Referring to FIG. 2, in the display device 100 according to the present disclosure, the pixel driver circuit SPC of each of the subpixels SP may further include a sensing transistor SENT. The sensing transistor SENT may switch the connection between the second node N2 of the driving transistor DRT and a reference voltage line RVL to which a reference voltage Vref is applied.

In response to the scan signal SCAN supplied through the scan line SCL, the sensing transistor SENT may control the connection between the second node N2 of the driving transistor DRT electrically connected to the pixel electrode PE of the emitting device ED and a corresponding reference voltage line RVL among a plurality of reference voltage lines RVL. In FIG. 2, the gate node of the sensing transistor SENT and the gate node of the scan transistor SCT are connected to the same scan line SCL. However, this is for illustrative purposes only, and the gate node of the sensing transistor SENT and the gate node of the scan transistor SCT may be respectively connected to different scan lines SCL.

The drain node or the source node of the sensing transistor SENT may be electrically connected to the reference voltage line RVL. The source node or the drain node of the sensing transistor SENT may be electrically connected to the second node N2 of the driving transistor DRT, and be electrically connected to the pixel electrode PE of the emitting device ED. The gate node of the sensing transistor SENT may be electrically connected to the scan line SCL to receive the scan signal SCAN applied therethrough.

Each of the driving transistor DRT, the scan transistor SCT, and the sensing transistor SENT may be an N-type transistor or a P-type transistor.

The 3T1C structure of the subpixel SP illustrated in FIG. 2 is only an example given for explanation. Rather, the subpixel structure may only include two transistors and one capacitor, further include one or more transistors, or further include one or more capacitors. All of the plurality of subpixels may have the same structure, or some of the plurality of subpixels may have a different structure.

In addition, the display device 100 according to the present disclosure may have a top emission structure or a bottom emission structure. Hereinafter, as an example, the display device 100 will be described as having a top emission structure.

Figure 3:
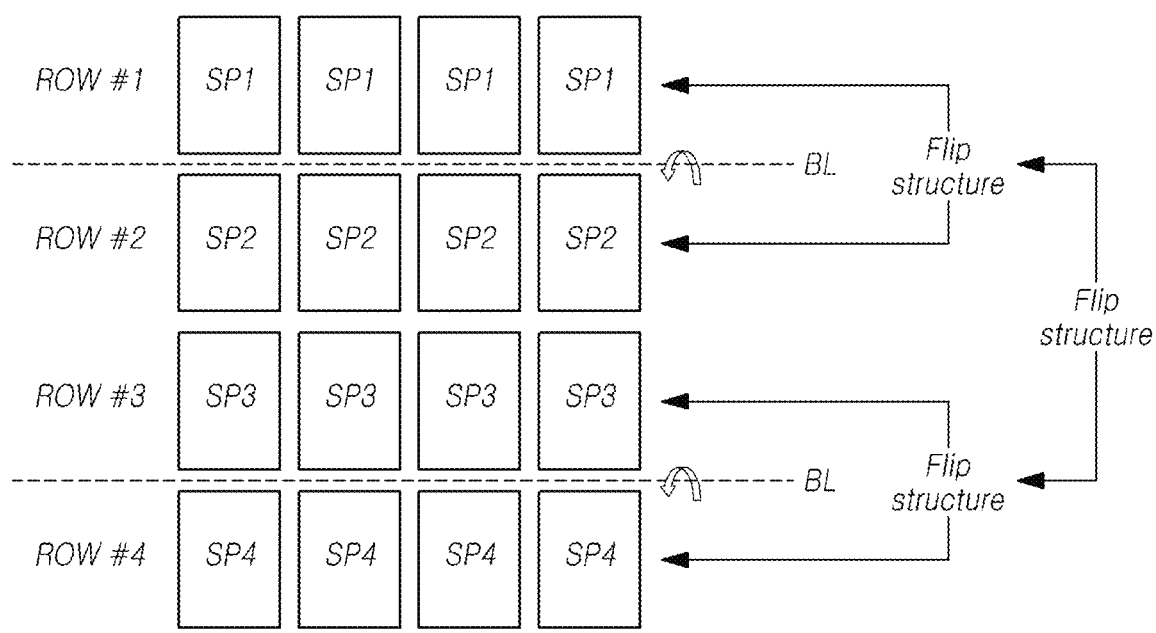
FIG. 3 illustrates a flip structure of subpixels in the display device according to the present disclosure.
Figure 4:
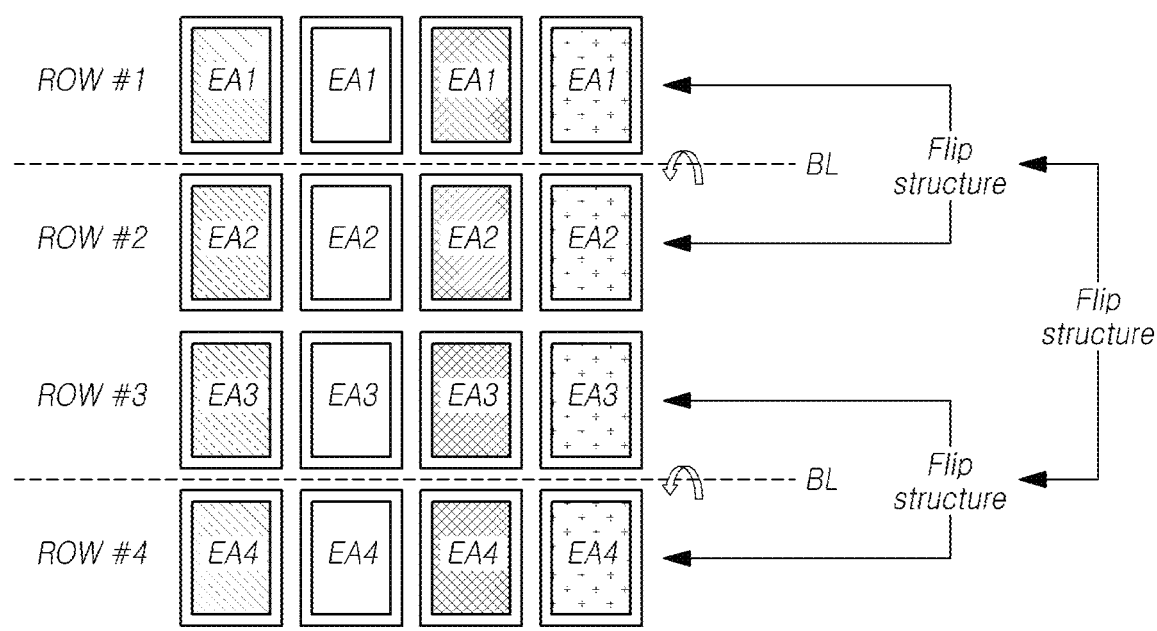
FIG. 4 illustrates a layout of subpixels having a top emission structure in the display device according to the present disclosure.

FIG. 3 illustrates a flip structure of the subpixels SP in the display device 100 according to the present disclosure, and FIG. 4 illustrates a layout of the subpixels SP having the top emission structure in the display device 100 according to the present disclosure.

Referring to FIG. 3, in the flip structure of the subpixels SP in the display device 100, two subpixels SP adjacent to each other in the vertical direction may be configured to be inverted with each other.

Referring to FIG. 3, the structure of first subpixels SP1 in a first subpixel row ROW #1 and the structure of second subpixels SP2 in a second subpixel row ROW #2 may be inverted with each other (i.e., have a flip shape). The structure of each of the first subpixels SP1 may include, for example, positions and/or shapes of devices (e.g., DRT, SCT, SENT, and Cst) in the pixel driver circuit SPC in each of the first subpixels SP1. The structure of each of the second subpixels SP2 may include, for example, positions and/or shapes of devices (e.g., DRT, SCT, SENT, and Cst) in the pixel driver circuit SPC in each of the second subpixels SP2.

Referring to FIG. 3, the structure of third subpixels SP3 in a third subpixel row ROW #3 and the structure of fourth subpixels SP4 in a fourth subpixel row ROW #4 may be inverted with each other (i.e., a flip shape). As described above, referring to FIG. 3, the structure of the first subpixel row ROW #1 and the second subpixel row ROW #2 and the structure of the third subpixel row ROW #3 and the fourth subpixel row ROW #4 may be inverted with each other (i.e., a flip shape). Thus, referring to FIG. 5, the structure of the second subpixels SP2 in the second subpixel row ROW #2 and the structure of the third subpixels SP3 in the third subpixel row ROW #3 may be inverted (i.e., have a flip shape) with each other.

FIG. 4 illustrates emitting areas EA1, EA2, EA3, and EA4 of the subpixels SP1, SP2, SP3, and SP4 illustrated in FIG. 3. The display device 100 according to the present disclosure has the top emission structure. Since there is no decrease in the aperture ratio due to the repair structure as will be described later, the emitting areas EA1, EA2, EA3, and EA4 of the subpixels SP1, SP2, SP3, and SP4 may be maximized without a decrease in the area due to the repair structure.

Figure 5:
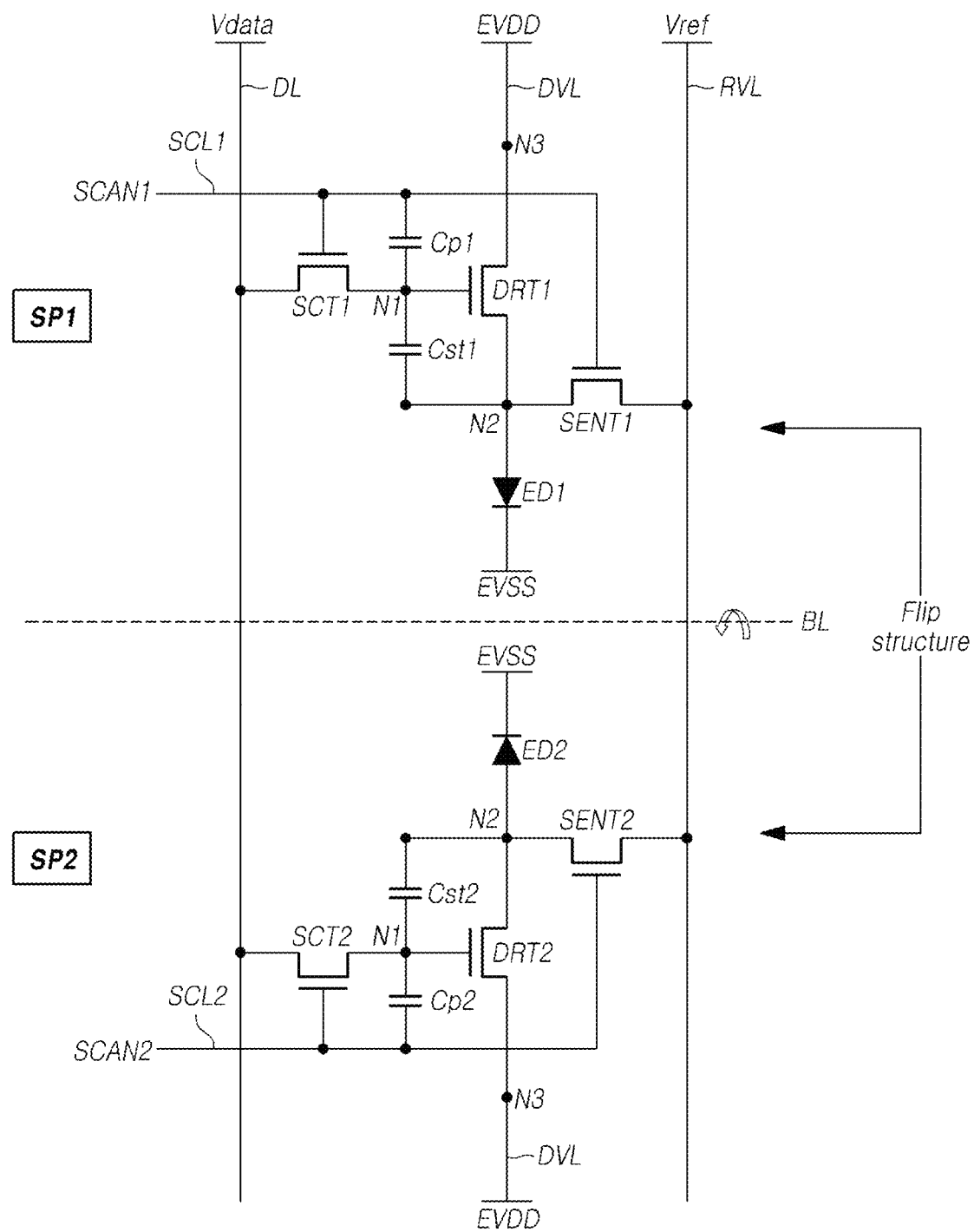
FIG. 5 illustrates an equivalent circuit of a first subpixel and a second subpixel when the first subpixel and the second subpixel have a flip structure with respect to each other in the display device according to the present disclosure.

FIG. 5 illustrates an equivalent circuit of a first subpixel SP1 and a second subpixel SP2 when the first subpixel SP1 and the second subpixel SP2 have a flip structure with each other in the display device 100 according to the present disclosure.

Referring to FIG. 5, the first subpixel SP1 may include a first emitting device ED1, a first driving transistor DRT1, a first scan transistor SCT1, a first sensing transistor SENT1, and a first storage capacitor Cst1. The gate node of each of the first scan transistor SCT1 and the gate node of the first sensing transistor SENT1 may be connected in common to a single first scan line SCL1 to simultaneously receive a first scan signal SCAN1 applied therethrough. The first scan line SCL1 is a type of gate line GL.

Referring to FIG. 5, the second subpixel SP2 may include a second emitting device ED2, a second driving transistor DRT2, a second scan transistor SCT2, and a second sensing transistor SENT2, and a second storage capacitor Cst2. The gate node of the second scan transistor SCT2 and the gate node of the second sensing transistor SENT2 may be connected in common to a single second scan line SCL2 to simultaneously receive a second scan signal SCAN2 applied therethrough. The second scan line SCL2 is a type of gate line GL.

Referring to FIG. 5, the first subpixel SP1 is included in the first subpixel row ROW #1, and the second subpixel SP2 is included in the second subpixel row ROW #2. Thus, the first subpixel SP1 and the second subpixel SP2 may be connected in common to a single data line DL, and may be connected in common to a single reference voltage line RLV.

In addition, since the first subpixel SP1 is included in the first subpixel row ROW #1 and the second subpixel SP2 is included in the second subpixel row ROW #2, the first subpixel SP1 and the second subpixel SP2 may be connected in common to a single driving voltage line DVL.

The first subpixel SP1 and the second subpixel SP2 may be inverted (i.e., have a flip structure) with each other with respect to the boundary line BL between the first subpixel SP1 and the second subpixel SP2. That is, the structure of the second subpixel SP2 and the structure of the first subpixel SP1 may be inverted (i.e., symmetric) with respect to each other. In other words, the first subpixel SP1 and the second subpixel SP2 may be symmetric with respect to the boundary line BL.

Referring to FIG. 5, the structure (e.g., position and/or shape) of the devices DRT1, SCT1, SENT1, and Cst1 in the first subpixel SP1 and the structure (e.g., position and/or shape) of the devices DRT2, SCT2, SENT2, and Cst2 in the second subpixel SP2 may be inverted with each other with respect to the boundary line BL. For example, the structure (e.g., position and/or shape) of the devices DRT1, SCT1, SENT1, and Cst1 in the first subpixel SP1 and the structure (e.g., position and/or shape) of the devices DRT2, SCT2, SENT2, and Cst2 in the second subpixel SP2 may be symmetric with respect to the boundary line BL.

In addition, referring to FIG. 5, in a situation in which the first subpixel SP1 and the second subpixel SP2 adjacent to each other have the flip structure (i.e., the symmetric structure), when the overlay between metals to be in contact with each other (e.g., the overlay between the first scan line SCL1 and a first auxiliary pattern AUX1 and the overlay between the second scan line SCL2 and a second auxiliary pattern AUX2) is misaligned due to a process deviation, a first parasitic capacitance Cp1 in the first subpixel SP1 and a second parasitic capacitance Cp2 in the second subpixel SP2 may be changed, respectively. For example, the first parasitic capacitance Cp1 may be increased, whereas the second parasitic capacitance Cp2 may be decreased. In contrast, the first parasitic capacitance Cp1 may be decreased, whereas the second parasitic capacitance Cp2 may be increased.

Consequently, the difference between the first parasitic capacitance Cp1 and the second parasitic capacitance Cp2 may be significantly increased. This may have an effect on the gate node of the first driving transistor DRT1 of the first subpixel SP1 and the gate node of the second driving transistor DRT2 of the second subpixel SP2, thereby changing the voltage state of each of the gate nodes. Such changes in the voltage state of each of the gate node of the first driving transistor DRT1 of the first subpixel SP1 and the gate node of the second driving transistor DRT2 of the second subpixel SP2 may cause a luminance deviation between the first subpixel SP1 and the second subpixel SP2 having the flip structure (i.e., the symmetric structure). In this regard, aspects propose a scan symmetric structure to be described later with reference to FIGS. 7 to 11B.

Figure 6:
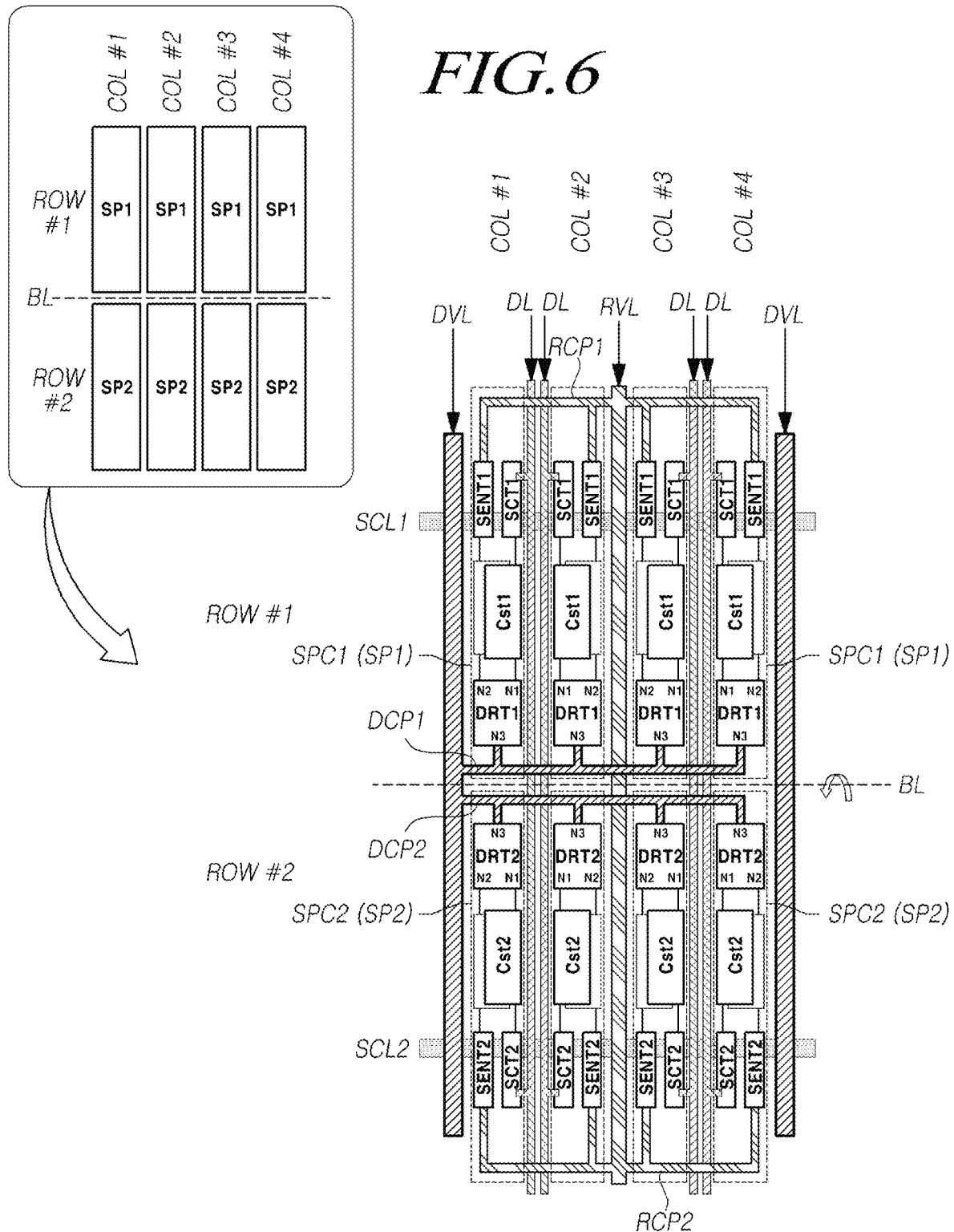
FIG. 6 illustrates a plan structure of a first subpixel row and a second subpixel row in the display device according to the present disclosure.

FIG. 6 illustrates a plan structure of a first subpixel row ROW #1 and a second subpixel row ROW #2 in the display device 100 according to aspects. In FIG. 6, the flip structure of the circuit illustrated in FIG. 5 is depicted in a plan diagram of a panel.

In FIG. 6, eight subpixels arranged in two rows and two columns are illustrated. Referring to FIG. 6, four first subpixels SP1 in a first subpixel row ROW #1 include four first pixel driver circuits SPC1, and four second subpixels SP2 in a second subpixel row ROW #2 adjacent to the first subpixel row ROW #1 include four second pixel driver circuits SPC2.

The first scan line SCL1 may be disposed in the first subpixel row ROW #1, and the second scan line SCL2 may be disposed in the second subpixel row ROW #2. The first scan line SCL1 may be connected to the gate nodes of the first scan transistor SCT1 and the first sensing transistor SENT1 in each of the four first subpixels SP1.

Two data lines DL may be disposed between a first subpixel column COL #1 and a second subpixel column COL #2. One of the two data lines DL may be connected to the drain node (or the source node) of each of the scan transistors SCT1 and SCT2 of the subpixels SP1 and SP2 of the first subpixel column COL #1, and the other of the two data lines DL may be connected to the drain node (or the source node) of each of the scan transistors SCT1 and SCT2 of the subpixels SP1 and SP2 of the second subpixel column COL #2.

Two data lines DL may be disposed between a third subpixel column COL #3 and a fourth subpixel column COL #4. One of the two data lines DL may be connected to the drain node (or the source node) of each of the scan transistors SCT1 and SCT2 of the subpixels SP1 and SP2 of the third subpixel column COL #3, and the other of the two data lines DL may be connected to the drain node (or the source node) of each of the scan transistors SCT1 and SCT2 of the subpixels SP1 and SP2 of the fourth subpixel column COL #4.

The first to fourth subpixel columns COL #1 to COL #4 may receive a reference voltage Vref through a single reference voltage line RVL. In the illustration of FIG. 6, the single reference voltage line RVL may be disposed between the second subpixel column COL #2 and the third subpixel column COL #3.

The reference voltage line RVL may be connected to the drain node (or the source node) of the first sensing transistor SENT1 in each of the four first subpixels SP1 through a first reference connection pattern RCP1 disposed in the first subpixel row ROW #1. The reference voltage line RVL may be connected to the drain node (or the source node) of the first sensing transistor SENT1 included in each of the four second subpixels SP2 through a second reference connection pattern RCP2 disposed in the second subpixel row ROW #2.

The first to fourth subpixel columns COL #1 to COL #4 may receive a driving voltage EVDD through a single driving voltage line DVL. In the illustration of FIG. 8, the single driving voltage line DVL may be disposed on one side (to the left) of the first subpixel column COL #1. The driving voltage line DVL may be connected to the third node N3 of a first driving transistor DRT3 in each of the four first subpixels SP1 through a first drive connection pattern DCP1 disposed in the first subpixel row ROW #1. The driving voltage line DVL may be connected to the third node N3 of a first driving transistor DRT3 in each of the four second subpixels SP2 through a second drive connection pattern DCP2 disposed in the second subpixel row ROW #2.

Referring to FIG. 6, four first pixel driver circuits SPC1 in the first subpixel row ROW #1 and four second pixel driver circuits SPC2 in the second subpixel row ROW #2 may have a flip structure. That is, the position and/and shape of devices DRT2, Cst2, SCT2, and SENT2 included in the second pixel driver circuit SPC2 may be configured to be inverted with respect to the position and/and shape of devices DRT1, Cst1, SCT1, and SENT1 included in the first pixel driver circuit SPC1 with respect to the boundary line BL.

Referring to FIG. 8, signal lines SCL1, RCP1, and DCP1 disposed in a row direction in the first subpixel row ROW #1 and signal lines SCL2, RCP2, and DCP2 disposed in the row direction in the second subpixel row ROW #2 may be configured to be inverted with respect to each other. That is, the positions of the signal lines SCL1, RCP1, and DCP1 disposed in the row direction in the first subpixel row ROW #1 and the positions of the signal lines SCL2, RCP2, and DCP2 disposed in the row direction in the second subpixel row ROW #2 may be symmetric with respect to the boundary line BL.

Hereinafter, a plan structure and a cross-sectional structure (i.e., a vertical structure) of the first scan line SCL1 and the second scan line SCL2 suitable for the flip structure of the first subpixel SP1 and the second subpixel SP2 will be described.

Figure 7:
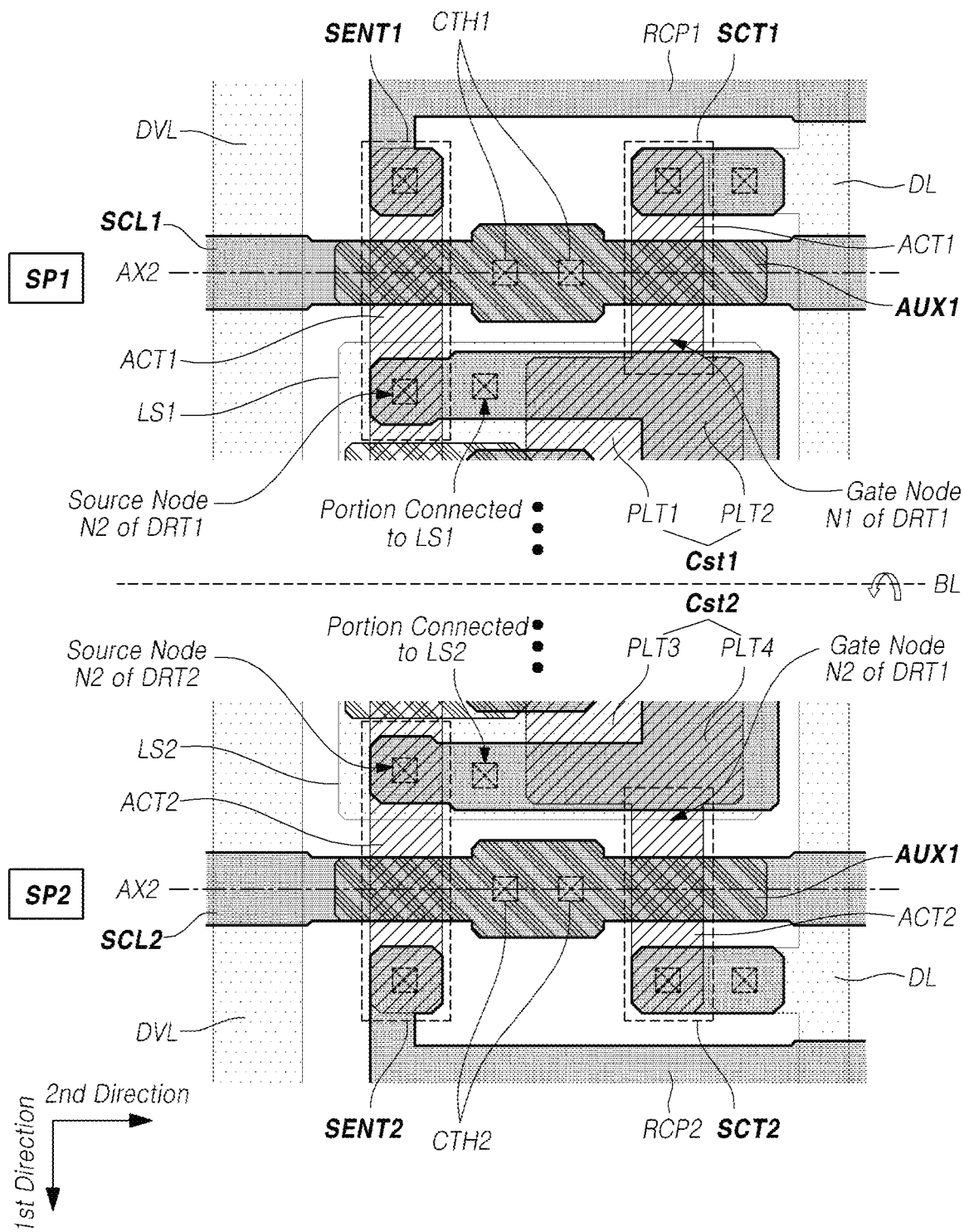
FIGS. 7, 8A, 8B, 9, 10, 11A, and 11B illustrate a plan structure and a cross-sectional (i.e., vertical) structure for the first scan line and the second scan line suitable for the flip structure between the first subpixel and the second subpixel in the display device according to aspects.

FIG. 7 is a plan diagram illustrating an area of the first subpixel SP1 through which the first scan line SCL1 extends and an area of the second subpixel SP2 through which the second scan line SCL2 extends in the display device 100 according to the present disclosure in which the first subpixel SP1 and the second subpixel SP2 have a flip structure with respect to each other.

Figure 8A:
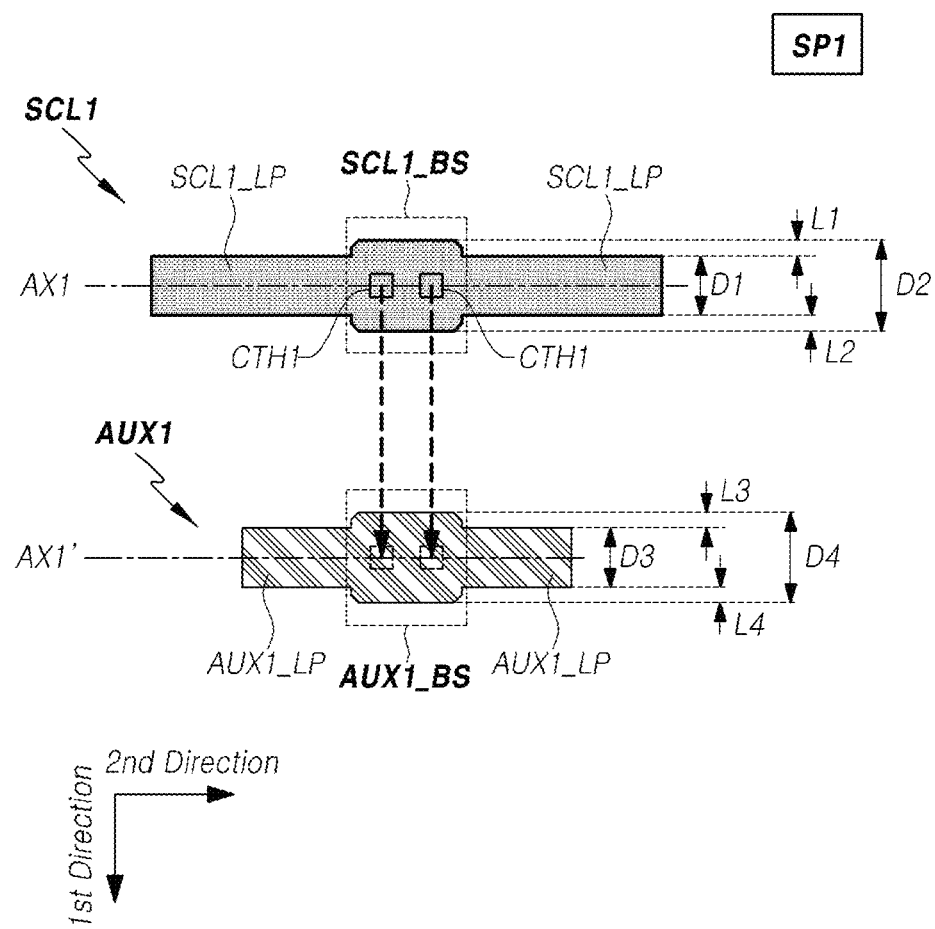

FIG. 8A illustrates the first scan line SCL1 and the first auxiliary pattern AUX1 in the area of the first subpixel SP1 through which the first scan line SCL1 extends in the display device 100 according to the present disclosure.

Figure 8B:
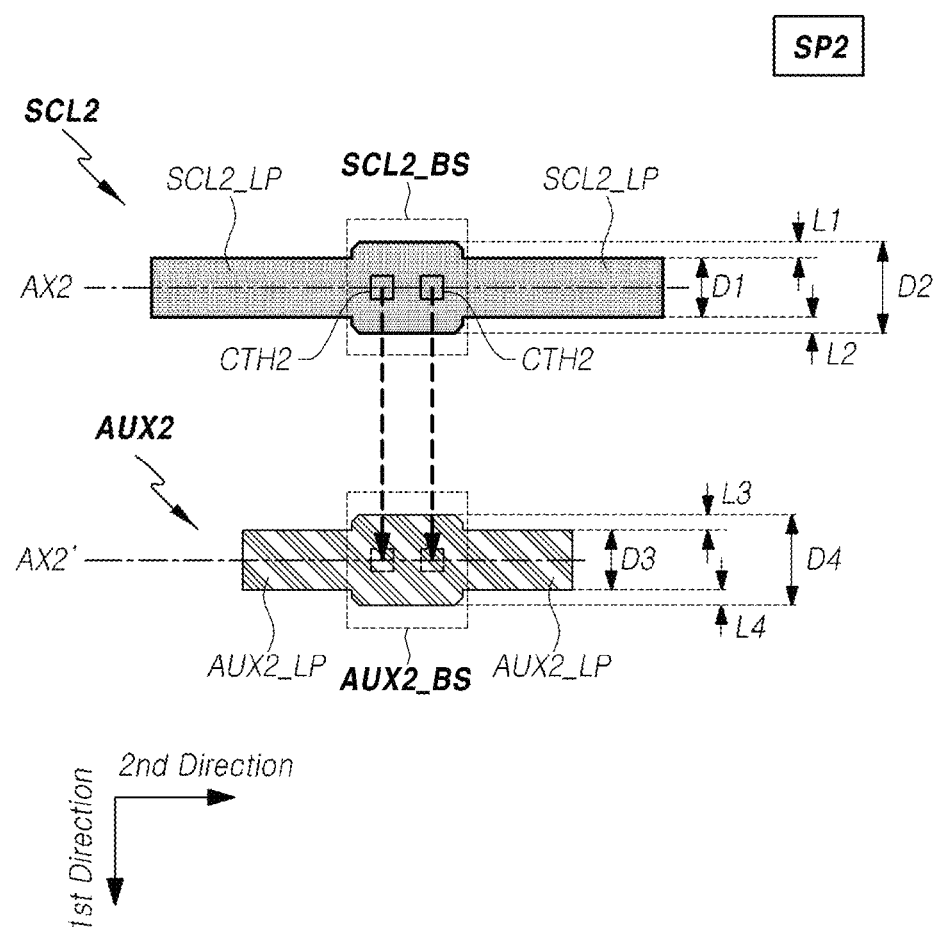
Figure 9:
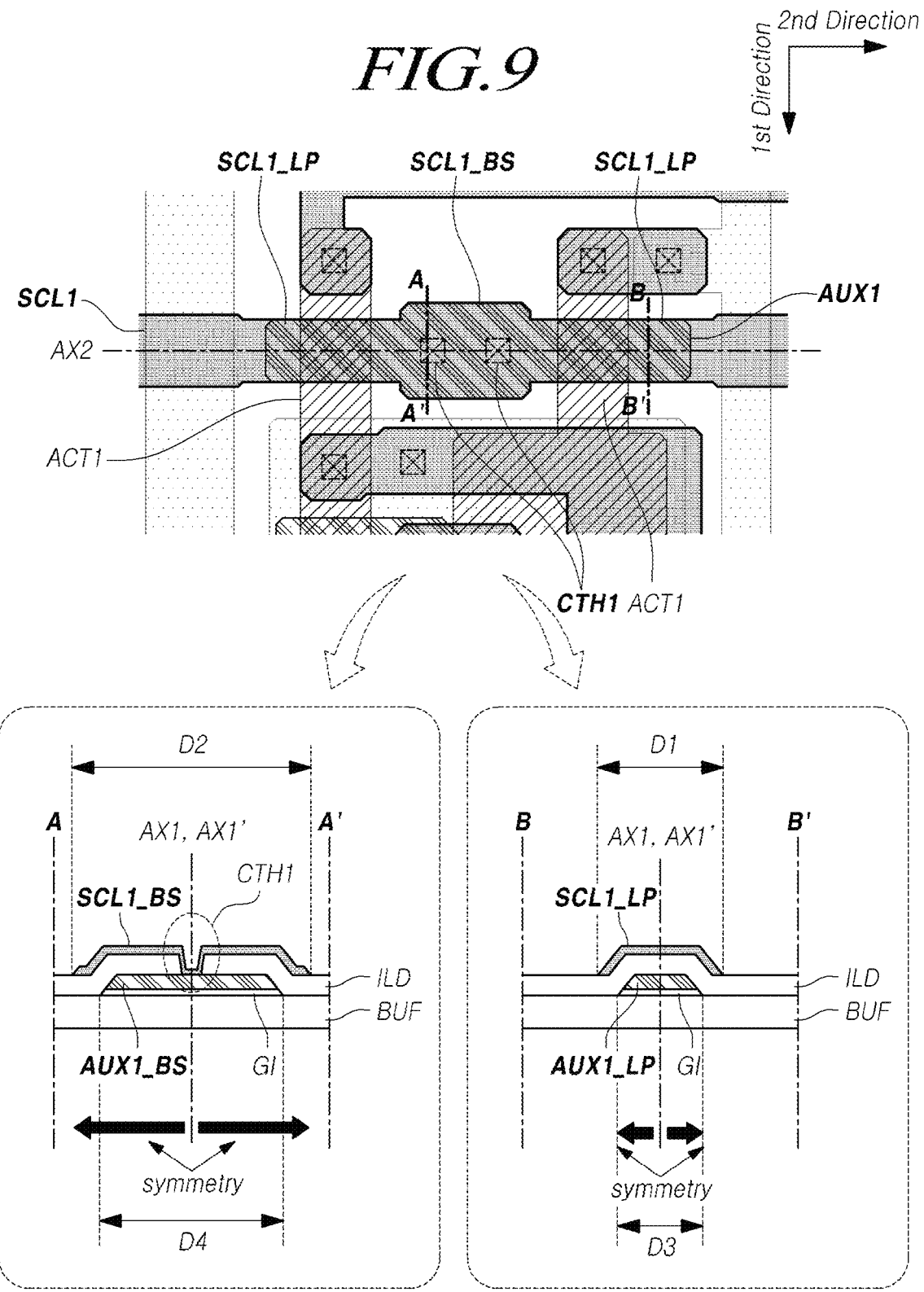
Figure 10:
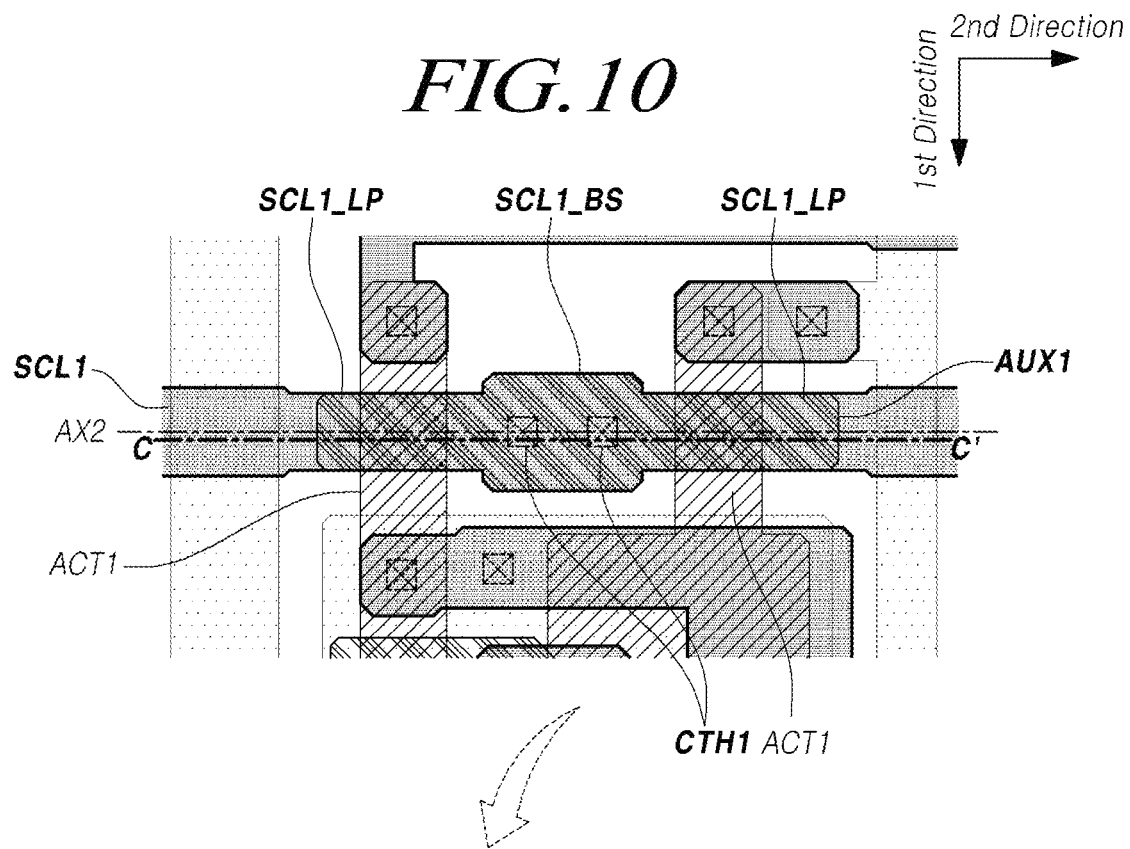
Figure 10:
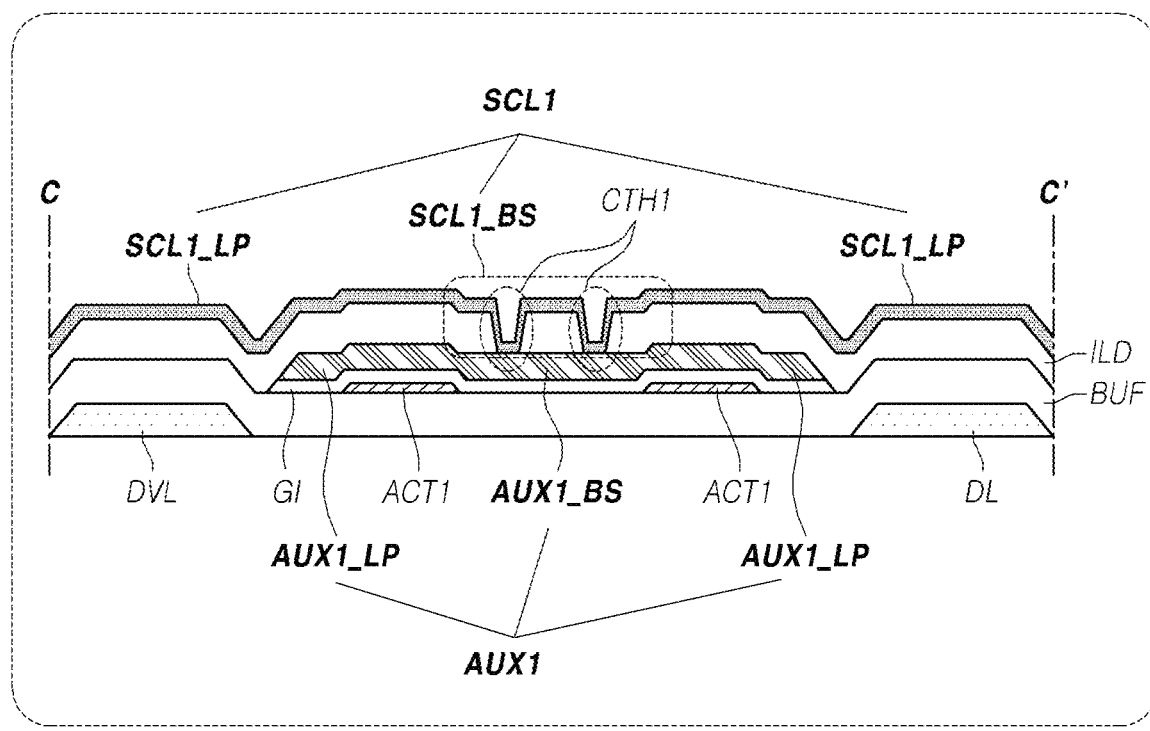

FIG. 8B illustrates the second scan line SCL2 and the second auxiliary pattern AUX2 in the area of the second subpixel SP2 through which the second scan line SCL2 extends in the display device 100 according to aspects. FIG. 9 illustrates cross-sections of two portions A-A' and B-B' in which the first scan line SCL1 and the first auxiliary pattern AUX1 overlap with in the area of the first subpixel SP1, through which the first scan line SCL1 extends, in the display device 100 according to aspects. FIG. 10 illustrates a cross-section of a portion C-C' in which the first scan line SCL1 and the first auxiliary pattern AUX1 overlap with in the area of the first subpixel SP1, through which the first scan line SCL1 extends, in the display device 100 according to aspects.

Referring to FIG. 7, the display device 100 according to aspects may include the substrate SUB, the first scan line SCL1 disposed on or over the substrate SUB and extending through the first subpixel SP1 among the plurality of subpixels SP, and the first auxiliary pattern AUX1 disposed in the area of the first subpixel SP1 and electrically connected to the first scan line SCL1 through one or more first contact holes CTH1.

For example, the first auxiliary pattern AUX1 may be positioned on or over a gate insulating film GI on or over a buffer layer BUF, and include a gate metal material. The first scan line SCL1 may be positioned on or over an interlayer insulating film ILD on or over the first auxiliary pattern AUX1, and may include a source-drain metal material.

Referring to FIGS. 7, 9, and 10, the display device 100 according to aspects may include the interlayer insulating film ILD positioned between the first scan line SCL1 and the first auxiliary pattern AUX1, and having the one or more first contact holes CTH1.

Referring to FIGS. 7, 8A, and 9, the first scan line SCL1 may protrude in the top-down direction to be symmetrical with respect to the longitudinal axis (i.e., an axis in a second direction), and the first auxiliary pattern AUX1 may protrude in the top-down direction to be symmetrical with respect to the longitudinal axis (i.e., an axis in the second direction).

Referring to FIGS. 7, 8A, and 9, a line area SCL1_BS including portions protruding in the top-down direction from the first scan line SCL1 and a line area AUX1_BS including portions protruding in the top-down direction from the first auxiliary pattern AUX1 may be connected through the one or more first contact holes CTH1.

Referring to FIGS. 7 and 8A, in the fabrication of a panel, when there is no process deviation, a portion of the line area AUX1_BS including the portions protruding in the top-down direction from the first auxiliary pattern AUX1 may completely overlap with the line area SCL1_BS including the portions protruding in the top-down direction from the first scan line SCL1.

In the fabrication of a panel, when there is a process deviation, a portion of the line area AUX1_BS including portions protruding in the top-down direction from the first auxiliary pattern AUX1 may not overlap with the line area SCL1_BS including portions protruding in the top-down direction from the first scan line SCL1.

Referring to FIG. 7, the display device 100 according to the present disclosure may further include the substrate SUB, the second scan line SCL2 disposed on or over the substrate SUB and extending through the second subpixel SP2 among the plurality of subpixels SP adjacent to the first subpixel SP1, and the second auxiliary pattern AUX2 disposed in the area of the second subpixel SP2 and electrically connected to the second scan line SCL2 through one or more second contact holes CTH2.

For example, the second auxiliary pattern AUX2 may be positioned on or over the gate insulating film GI on or over the buffer layer BUF, and include a gate metal material. The second scan line SCL2 may be positioned on or over the interlayer insulating film ILD positioned on or over the first auxiliary pattern AUX1, and include a source-drain metal material.

Referring to FIGS. 7, 9 and 10, the interlayer insulating film ILD may be positioned between the second scan line SCL2 and the second auxiliary pattern AUX2, and have the one or more second contact holes CTH2.

Referring to FIGS. 7 and 8B, the second scan line SCL2 may protrude in the top-bottom direction to be symmetrical with respect to a longitudinal axis (i.e., an axis in the second direction), and the second auxiliary pattern AUX2 may protrude in the top-bottom direction to be symmetrical with respect to a longitudinal axis (i.e., an axis in the second direction).

Referring to FIGS. 7 and 8B, a line area AUX2_BS including portions protruding in the top-bottom direction from the second auxiliary pattern AUX2 and a line area SCL2_BS including portions protruding in the top-bottom direction from the second scan line SCL2 may be connected through the one or more contact holes CTH2.

Referring to FIGS. 7 and 8B, in the fabrication of a panel, when there is no process deviation, a portion of the line area AUX2_BS including the portions protruding in the top-bottom direction from the second auxiliary pattern AUX2 may completely overlap with the line area SCL2_BS including the portions protruding in the top-bottom direction from the second scan line SCL2.

In the fabrication of a panel, when there is a process deviation, the portion of the line area AUX2_BS including the portions protruding in the top-bottom direction from the second auxiliary pattern AUX2 may not overlap with the line area SCL2_BS including the portions protruding in the top-bottom direction from the second scan line SCL2.

Referring to FIGS. 7 and 8A, the display device 100 according to the present disclosure may include the substrate SUB, a data line DL disposed on or over the substrate SUB in the first direction, the first scan line SCL1 disposed in the second direction intersecting the first direction, and the first auxiliary pattern AUX1 disposed in the second direction in the area of the first subpixel SP1 among the plurality of subpixels SP and electrically connected to the first scan line SCL1 through the one or more first contact holes CTH1.

Referring to FIGS. 7, 8A, and 9, the first scan line SCL1 may include first line portions SCL1_LP having a first width D1 in the first direction and a contact portion SCL1_BS having a second width D2 in the first direction, the second width D2 being wider than the first width D1. The first auxiliary pattern AUX1 may include first line pattern portions AUX1_LP having a third width D3 in the first direction and a first seating pattern portion AUX1_BS having a fourth width D4 in the first direction, the fourth width D4 being wider than the third width D3.

Referring to FIGS. 7, 8A, and 9, the first contact portion SCL1_BS of the first scan line SCL1 may be connected to the first seating pattern portion AUX1_BS of the first auxiliary pattern AUX1 through the one or more first contact holes CTH1.

Referring to FIGS. 7, 8A, and 9, the first contact portion SCL1_BS of the first scan line SCL1 may be symmetrical with respect to the central axis AX1 of the first line portion SCL1_LP of the first scan line SCL1 in the second direction. The first seating pattern portion AUX1_BS of the first auxiliary pattern AUX1 may be symmetrical with respect to the central axis AX1' of the first line pattern portion AUX1_LP of the first auxiliary pattern AUX1 in the second direction.

Referring to FIGS. 7, 8A, and 9, the first width D1 of the first line portion SCL1_LP in the first scan line SCL1 may match the third width D3 of the first line pattern portion AUX1_LP in the first auxiliary pattern AUX1. The second width D2 of the first contact portion SCL1_BS in the first scan line SCL1 may match the fourth width D4 of the first seating pattern portion AUX1_BS in the first auxiliary pattern AUX1.

Referring to FIG. 8A, in in the first scan line SCL1, the length L1 by which the first contact portion SCL1_BS protrudes from the first line portion SCL1_LP in the direction opposite to the first direction may be the same as the length L2 by which the first contact portion SCL1_BS protrudes from the first line portion SCL1_LP in the first direction. In the first auxiliary pattern AUX1, the length L3 by which the first seating pattern portion AUX1_BS protrudes from the first line pattern portion AUX1_LP in the direction opposite to the first direction may be the same as the length L3 by which the first seating pattern portion AUX1_BS protrudes from the first line pattern portion AUX1_LP in the first direction.

Referring to FIGS. 6 and 7, the first subpixel SP1 may further include the first storage capacitor Cst1 in addition to the first driving transistor DRT1, the first scan transistor SCT1, and the first sensing transistor SENT1.

Referring to FIG. 7, the first scan line SCL1 and the first auxiliary pattern AUX1 may intersect a first active layer ACT1 of the first scan transistor SCT1 in the first subpixel SP1. The first scan line SCL1 and the first auxiliary pattern AUX1 may intersect a first active layer ACT1 of the first sensing transistor SENT1 in the first subpixel SP1.

The gate node of the first scan transistor SCT1 may receive a first scan signal from the first scan line SCL1. The gate node of the first sensing transistor SENT1 may receive the first scan signal from the first scan line SCL1.

Referring to FIGS. 6 and 7, the second subpixel SP2 may further include the second storage capacitor Cst2 in addition to the second driving transistor DRT2, the second scan transistor SCT2, and the second sensing transistor SENT2.

Referring to FIG. 7, the second scan line SCL2 and the second auxiliary pattern AUX2 may intersect a second active layer ACT2 of the second scan transistor SCT2 in the second subpixel SP2. The second scan line SCL2 and the second auxiliary pattern AUX2 may intersect a second active layer ACT2 of the second sensing transistor SENT2 in the second subpixel SP2.

The gate node of the second scan transistor SCT2 may receive a second scan signal from the second scan line SCL2. The gate node of the second sensing transistor SENT2 may receive the second scan signal from the second scan line SCL2.

Referring to FIG. 7, the first storage capacitor Cst1 of the first subpixel SP1 may include a first plate PLT1 and a second plate PLT2.

The first plate PLT1 may be a metal corresponding to the first node N1 that is the gate node of the first driving transistor DRT1. The first plate PLT1 may be a source electrode (or a drain electrode) of the first scan transistor SCT1 or a metal electrically connected to the source electrode (or the drain electrode) of the first scan transistor SCT1. The first plate PLT1 may be a conductorized portion of the first active layer ACT1 electrically corresponding to a source node (or a drain node) of the first scan transistor SCT1.

The second plate PLT2 may be a metal corresponding to the second node N2 that is a source node (or a drain node) of the first driving transistor DRT1. The second plate PLT2 may be a source node (or a drain node) of the first sensing transistor SENT1 or a metal electrically connected to the source node (or the drain node) of the first sensing transistor SENT1. The second plate PLT2 may be a conductorized portion of the first active layer ACT1 electrically corresponding to a source node (or a drain node) of the first sensing transistor SENT1.

Referring to FIG. 7, the second storage capacitor Cst2 of the second subpixel SP2 may include a third plate PLT3 and a fourth plate PLT4.

The third plate PLT3 may be a metal corresponding to the first node N1 that is the gate node of the second driving transistor DRT2. The third plate PLT3 may be a source node (or a drain node) of the second scan transistor SCT2 or a metal electrically connected to the source node (or the drain node) of the second scan transistor SCT2. The third plate PLT3 may be a conductorized portion of the second active layer ACT2 electrically corresponding to a source node (or a drain node) of the second scan transistor SCT2.

The fourth plate PLT4 may be a metal corresponding to the second node N2 that is a source node (or a drain node) of the second driving transistor DRT2. The fourth plate PLT4 may be is a source node (or a drain node) of the second sensing transistor SENT2 or a metal electrically connected to the source node (or the drain node) of the second sensing transistor SENT2. The fourth plate PLT4 may be a conductorized portion of the second active layer ACT2 electrically corresponding to the source node (or the drain node) of the second sensing transistor SENT2.

Referring to FIGS. 7 and 8B, the display device 100 according to the present disclosure may further include the second scan line SCL2 and the second auxiliary pattern AUX2. The second scan line SCL2 is disposed in the second direction and adjacent to the first scan line SCL1 in the first direction. The second auxiliary pattern AUX2 is disposed in the second direction in the area of the second subpixel SP2 among the plurality of subpixels adjacent to the first subpixel SP1 in the first direction, and is electrically connected to the second scan line SCL2 through the one or more second contact holes CTH2.

Referring to FIGS. 7 and 8B, the second scan line SCL2 may extend in the top-bottom direction to be symmetric with respect to the longitudinal axis (i.e., an axis in the second direction). The second auxiliary pattern AUX2 may extend in the top-bottom direction to be symmetric with respect to the longitudinal axis (i.e., an axis in the second direction).

Referring to FIGS. 7 and 8B, the second scan line SCL2 may include: a second line portion SCL2_LP having a first width D1 in the first direction; and a second contact portion SCL1_BS having a second width D2 in the first direction, the second width D2 being wider than the first width D1. The second auxiliary pattern AUX2 may include a second line pattern portion AUX1_LP having a third width D3 in the first direction; and a second seating pattern portion AUX1_BS having a fourth width D4 in the first direction, the fourth width D4 being wider than the third width D3 in the first direction.

Referring to FIGS. 7 and 8B, the second contact portion SCL1_BS of the second scan line SCL2 may be connected to the second seating pattern portion AUX1_BS of the first auxiliary pattern AUX1 through the one or more second contact holes CTH2. The second contact portion SCL1_BS of the second scan line SCL2 may be symmetrical with respect to the central axis of the second line portion SCL2_LP of the second scan line SCL2 in the second direction.

The second seating pattern portion AUX1_BS of the second auxiliary pattern AUX2 may be symmetrical with respect to the central axis AX2 of the second line pattern portion AUX1_LP of the second auxiliary pattern AUX2 in the second direction.

Referring to FIG. 8B, in the second scan line SCL2, the length L1 by which a second contact portion SCL2_BS protrudes from the second line portion SCL2_LP in the direction opposite to the first direction may be the same as the second length L2 by which a second contact portion SCL2_BS protrudes from the second line portion SCL2_LP in the first direction.

Referring to FIG. 8B, in the second auxiliary pattern AUX2, the length L3 by which a second seating pattern portion AUX2_BS protrudes from a second line pattern portion AUX2_LP in the direction opposite to the first direction may be the same as the length L4 by which the second seating pattern portion AUX2_BS protrudes from a second line pattern portion AUX2_LP in the first direction.

As described above, the first subpixel SP1 and the second subpixel SP2 have the flip structure with respect to each other, i.e., the second subpixel SP2 is the flip structure of the first subpixel SP1, whereas the first subpixel SP1 is the flip structure of the second subpixel SP2. Thus, the position of the first scan transistor SCT1 and the position of the second scan transistor SCT2 may be symmetrical with each other with respect to the boundary line between the first subpixel SP1 and the second subpixel SP2.

Referring to FIGS. 7 and 8A together with the A-A' cross-sectional diagram in FIG. 9, the first contact portion SCL1_BS of the first scan line SCL1 and the first seating pattern portion AUX1_BS of the first auxiliary pattern AUX1 may be symmetrical with respect to the axes AX1 and AX', respectively.

Referring to FIGS. 7 and 8A together with the B-B' cross-sectional diagram in FIG. 9, the first line portion SCL1_LP of the first scan line SCL1 and the first line pattern portion AUX1_LP of the first auxiliary pattern AUX1 may be symmetrical with respect to the axes AX1 and AX' in the second direction.

Referring to FIGS. 7 and 8A together with the C-C' cross-sectional diagram in FIG. 10, the first contact portion SCL1_BS of the first scan line SCL1 and the first seating pattern portion AUX1_BS of the first auxiliary pattern AUX1 may be connected to each other through the one or more first contact holes CTH1. The first contact portion SCL1_BS of the first scan line SCL1 and the first seating pattern portion AUX1_BS of the first auxiliary pattern AUX1 may be positioned between the two first active layers ACT1.

Referring to FIG. 10, a driving voltage line DVL and a data line DL may be positioned in a shield metal layer positioned below the buffer layer BUF. The shield metal layer may be a layer in which a shield metal disposed below a channel of the driving transistor DRT is formed. Herein, the shield metal will also be referred to as a light shield.

Figure 11A:
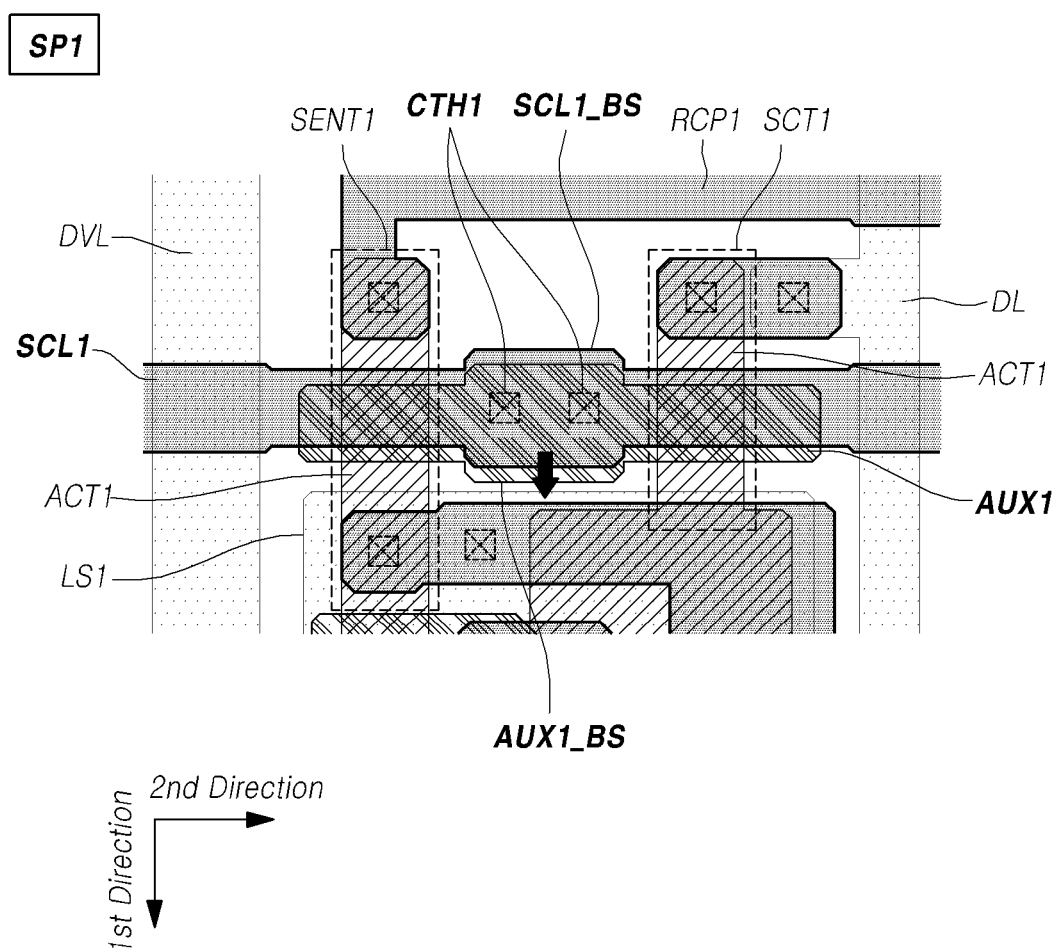
Figure 11B:
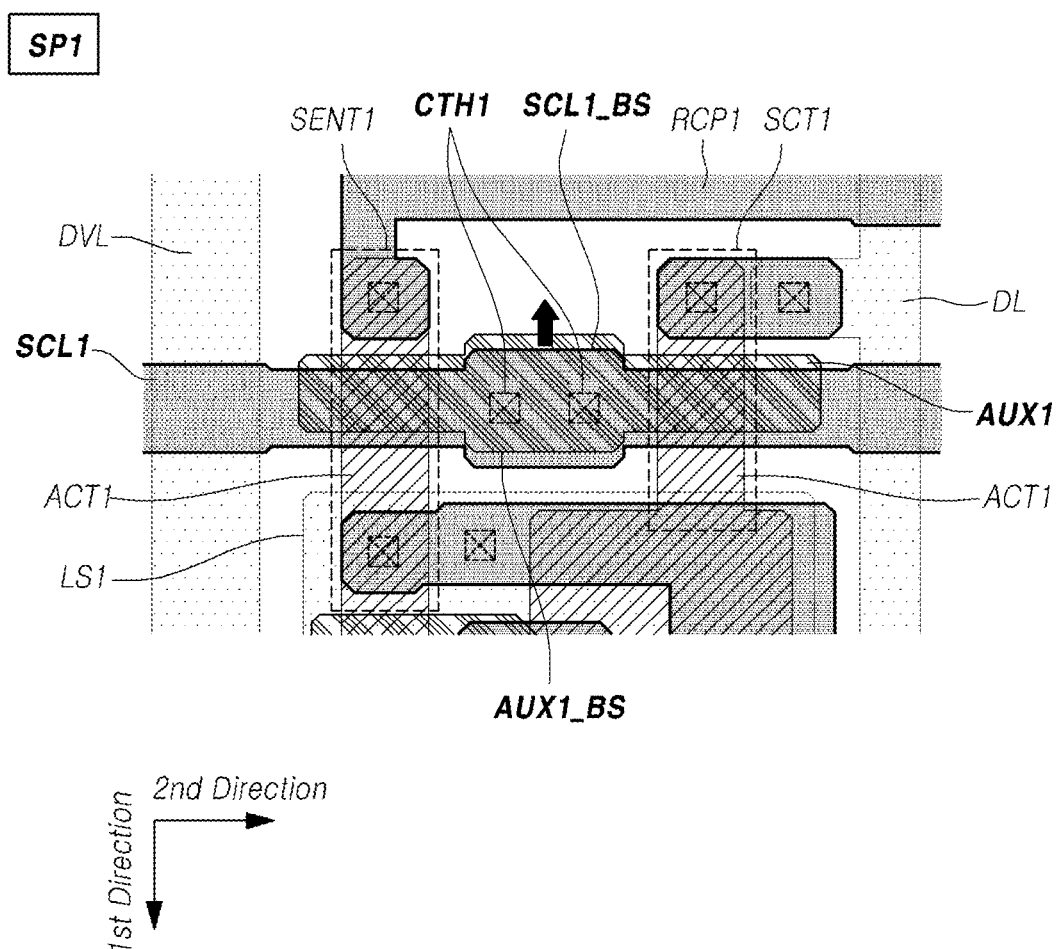

FIGS. 11A and 11B are plan diagrams illustrating an area of the first subpixel SP1 through which the first scan line SCL1 extends in situations in which the first auxiliary pattern AUX1 and the second auxiliary pattern AUX2 are shifted in the first direction and the direction opposite to the first direction, in response to a process deviation in a fabrication process of the display device 100 according to the present disclosure.

When no process deviation occurs in a panel fabrication process, the entirety of the first auxiliary pattern AUX1 may overlap with the first scan line SCL1. In this case, the first seating pattern portion AUX1_BS of the first auxiliary pattern AUX1 may be disposed to include all of the one or more first contact holes CTH1.

In contrast, when a process deviation occurs in the panel fabrication process, as illustrated in FIGS. 11A and 11B, a portion of the first auxiliary pattern AUX1 may not overlap with the first scan line SCL1.

Referring to FIGS. 11A and 11B, this is because the first contact portion SCL1_BS of the first scan line SCL1 is configured to protrude from the surrounding portions in the first direction and the direction opposite to the first direction while being symmetrical with respect to the longitudinal axis (i.e., the axis in the second direction) and the first seating pattern portion AUX1_BS of the first auxiliary pattern AUX1 is configured to protrude from the surrounding portions in the first direction and the direction opposite to the first direction while being symmetrical with respect to the longitudinal axis (i.e., the axis in the second direction).

Thus, the process deviation occurs during the panel fabrication process, and even in the case in which a portion of the first auxiliary pattern AUX1 does not overlap with the first scan line SCL1, as illustrated in FIGS. 11A and 11B, the first seating pattern portion AUX1_BS of the first auxiliary pattern AUX1 may be disposed to include all of the one or more first contact holes CTH1.

Referring to FIG. 11A, when the first auxiliary pattern AUX1 is pattered in a position shifted in the first direction due to the process deviation occurred during the panel fabrication process, a portion of the first auxiliary pattern AUX1 may not overlap the first scan line SCL1.

Referring to FIG. 11B, when the first auxiliary pattern AUX1 is pattered in a position shifted in the direction opposite to the first direction due to the process deviation occurred during the panel fabrication process, a portion of the first auxiliary pattern AUX1 may not overlap the first scan line SCL1.

Referring to FIGS. 11A and 11B, in a situation in which the process deviation has occurred in the panel fabrication process, when a portion of the first auxiliary pattern AUX1 does not overlap with the first scan line SCL1, a portion of the second auxiliary pattern AUX2 may not overlap with the second scan line SCL2.

Here, the area size of the portion of the first auxiliary pattern AUX1 not overlapping with the first scan line SCL1 may be the same as the area size of the portion of the second auxiliary pattern AUX2 not overlapping with the second scan line SCL2.

As described above, even in the case in which the process deviation has occurred in the panel fabrication process, the first seating pattern portion AUX1_BS of the first auxiliary pattern AUX1 may be disposed to include all of the one or more first contact holes CTH1, and the second seating pattern portion AUX1_BS of the second auxiliary pattern AUX2 may be disposed to include all of the one or more second contact holes CTH2.

Thus, electrical connection between the first auxiliary pattern AUX1 and the first scan line SCL1 may be normally established, and electrical connection between the second auxiliary pattern AUX2 and the second scan line SCL2 may be normally established.

Thus, when the first subpixel SP1 and the second subpixel SP2 adjacent to each other have a flip structure, even in the case in which the overlay between the first scan line SCL1 and the first auxiliary pattern AUX1 to be in contact with each other or the overlay between the second scan line SCL2 and the second auxiliary pattern AUX2 is misaligned due to the process deviation, a capacitance deviation in the subpixels having the flip structure (i.e., the symmetric structure), i.e., a deviation between the first parasitic capacitance Cp1 in the first subpixel SP1 and the second parasitic capacitance Cp2 in the second subpixel SP2, can be prevented, thereby reducing a luminance deviation between the first subpixel SP1 and the second subpixel SP2 having a flip structure (i.e., a symmetric structure).

When the first subpixel SP1 and the second subpixel SP2 do not have the flip structure, in the fabrication of a panel, even in the case in which the first plate PLT1 of the first storage capacitor Cst1 and the third plate PLT3 of the second storage capacitor Cst2 are patterned in positions shifted in the first direction or the direction opposite to the first direction, both the first storage capacitor Cst1 and the second storage capacitor Cst2 may be increased or reduced. Consequently, there is no deviation between the first storage capacitor Cst1 and the second storage capacitor Cst2.

When the first subpixel SP1 and the second subpixel SP2 have the flip structure, a process deviation may occur in the fabrication of a panel. Thus, when the first plate PLT1 of the first storage capacitor Cst1 and the third plate PLT3 of the second storage capacitor Cst2 are patterned in positions shifted in the first direction or the direction opposite to the first direction, one of the first storage capacitor Cst1 and the second storage capacitor Cst2 may be increased, whereas the other of the first storage capacitor Cst1 and the second storage capacitor Cst2 may be reduced. Consequently, a deviation may occur between the first storage capacitor Cst1 and the second storage capacitor Cst2.

Figure 12:
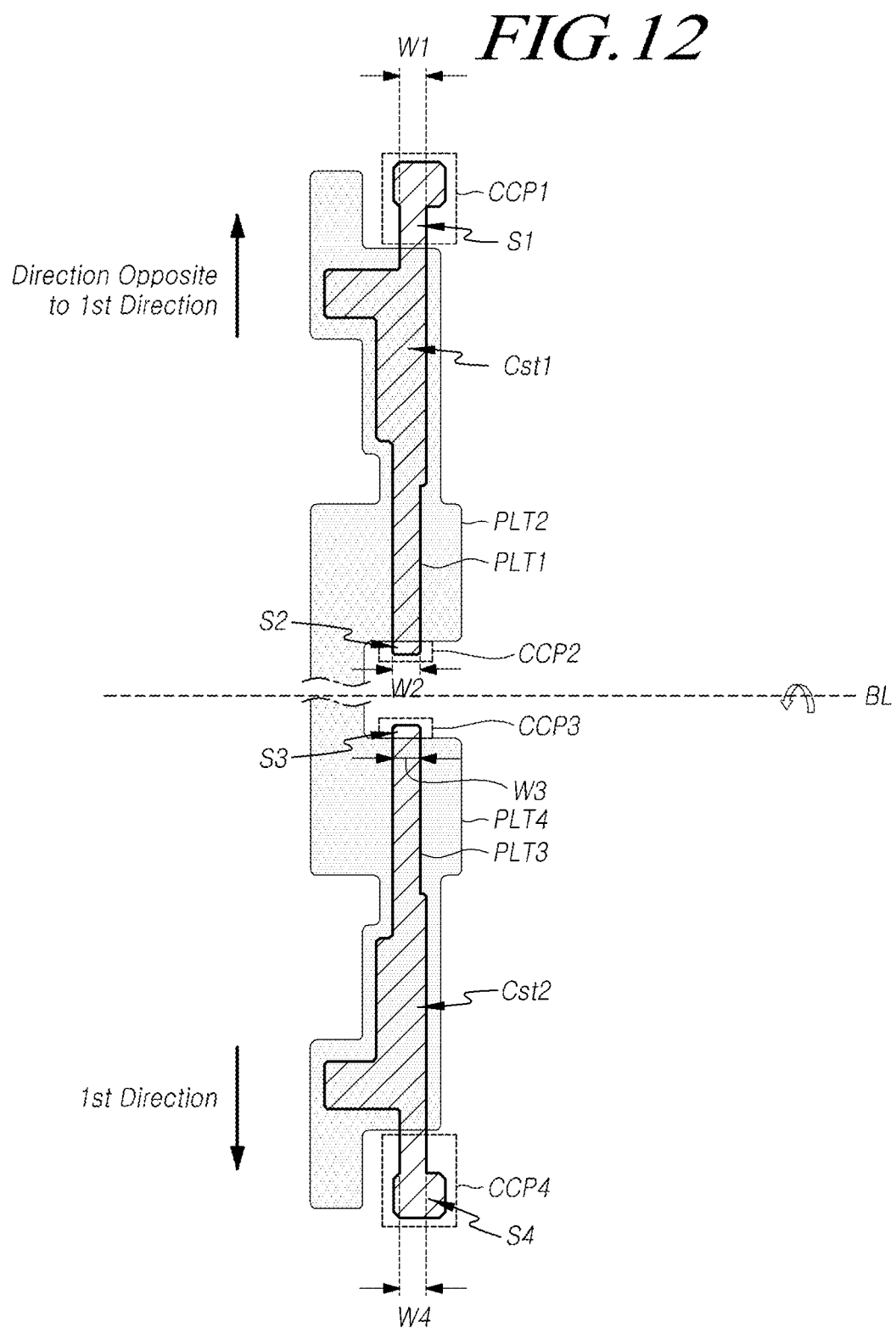
Figure 13A:
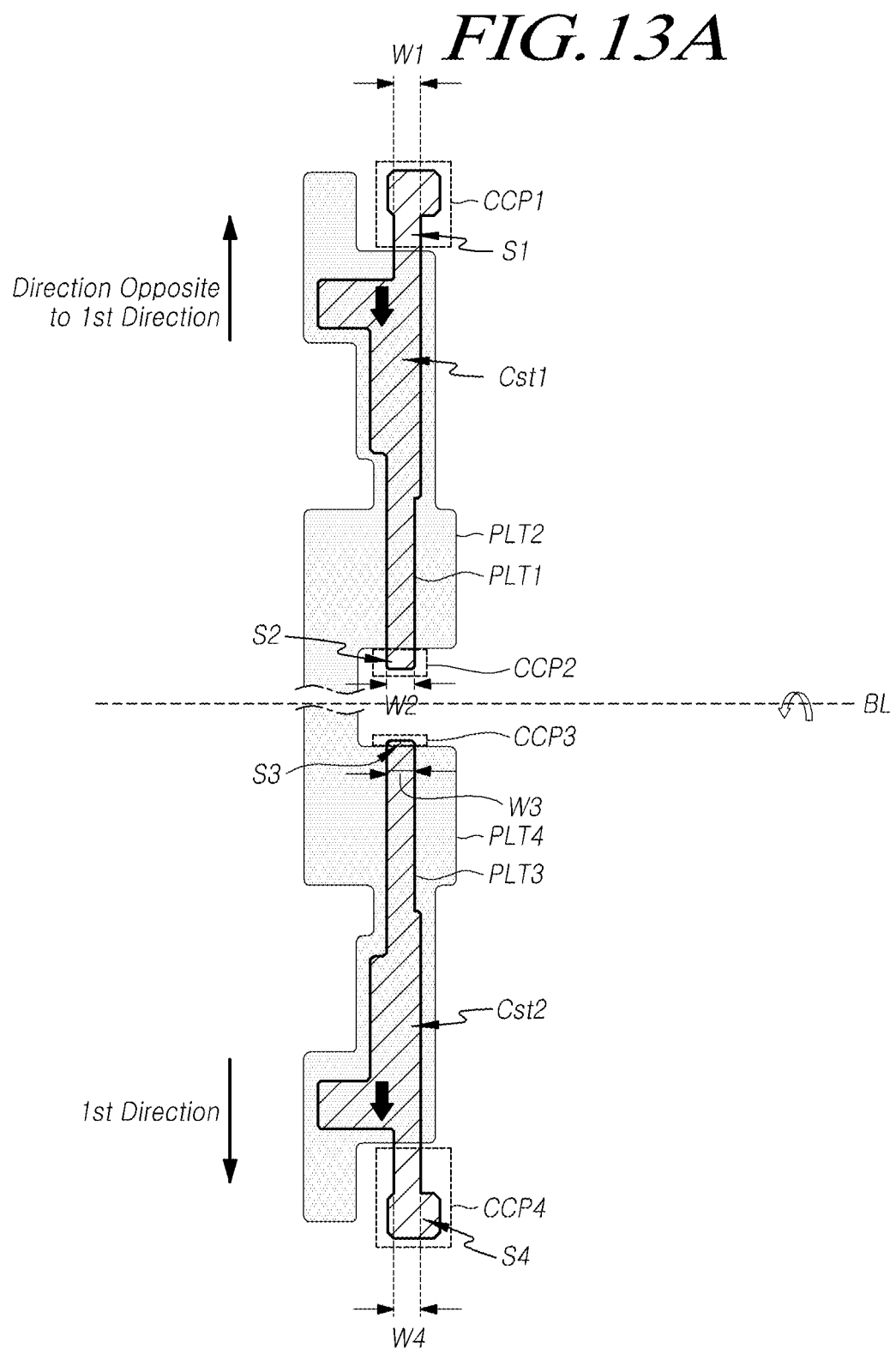

FIGS. 12, 13A, and 13B illustrate storage capacitor structures suitable for the flip structure between the first subpixel SP1 and the second subpixel SP2 in the display device according to the present disclosure.

Referring to FIG. 12, in order to reduce a storage capacitance deviation in the subpixel flip structure, the first storage capacitor Cst1 may have a compensation pattern structure protruding in the first direction and the direction opposite to the first direction, and the second storage capacitor Cst2 may have a compensation pattern structure protruding in the first direction and the direction opposite to the first direction.

Referring to FIG. 12, the first storage capacitor Cst1 of the first subpixel SP1 may include the first plate PLT1 and the second plate PLT2. The first plate PLT1 may include a first compensation pattern CCP1 extending in the direction opposite to the first direction so as not to overlap with the second plate PLT2 and a second compensation pattern CCP2 extending in the first direction so as not to overlap with the second plate PLT2.

Referring to FIG. 12, the second storage capacitor Cst2 of the second subpixel SP2 may include the third plate PLT3 and the fourth plate PLT4. The third plate PLT3 may include a third compensation pattern CCP3 extending in the direction opposite to the first direction so as not to overlap with the fourth plate PLT4 and a fourth compensation pattern CCP4 extending in the first direction so as not to overlap with the fourth plate PLT4.

Referring to FIG. 12, the shape of the first storage capacitor Cst1 and the shape of the second storage capacitor Cst2 may be symmetrical with respect to the boundary line between the first subpixel SP1 and the second subpixel SP2. Thus, the shape of the first compensation pattern CCP1 may correspond to the shape of the fourth compensation pattern CCP4, whereas the shape of the second compensation pattern CCP2 may correspond to the shape of the third compensation pattern CCP3.

Referring to FIG. 12, the width W1 of the first compensation pattern CCP1 may be the same as the width W2 of the second compensation pattern CCP2. The width W3 of the third compensation pattern CCP3 may be the same as the width W4 of the fourth compensation pattern CCP4.

Referring to FIG. 12, when no process deviation has occurred in the fabrication of a panel, the entirety of the first auxiliary pattern AUX1 may overlap with the first scan line SCL1. When the entirety of the first auxiliary pattern AUX1 overlap withs the first scan line SCL1, the area size S1 of the first compensation pattern CCP1 may be the same as the area size S4 of the fourth compensation pattern CCP4, whereas the area size S2 of the second compensation pattern CCP2 may be the same as the area size S3 of the third compensation pattern CCP3. Thus, when no process deviation has occurred, the first storage capacitor Cst1 and the second storage capacitor Cst2 can have the same capacitance.

Referring to FIG. 13A, when a process deviation has occurred in the fabrication of a panel, the first plate PLT1 of the first storage capacitor Cst1 and the third plate PLT3 of the second storage capacitor Cst2 may be patterned in positions shifted in the first direction. In this case, a portion of the first auxiliary pattern AUX1 may not overlap with the first scan line SCL1.

Here, the area size S1 of the first compensation pattern CCP1 may be smaller than the area size S4 of the fourth compensation pattern CCP4, and the area size S2 of the second compensation pattern CCP2 may be greater than the area size S3 of the third compensation pattern CCP3. Thus, even in the case in which the process deviation has occurred, the overlapping area between the first plate PLT1 and the second plate PLT2 can be maintained the same as before the occurrence of the process deviation, and the overlapping area between the third plate PLT3 and the fourth plate PLT4 can also be maintained the same as before the occurrence of the process deviation. Consequently, even in the case in which the process deviation has occurred, the first storage capacitor Cst1 and the second storage capacitor Cst2 can have the same capacitance.

Referring to FIG. 13B, when a process deviation has occurred in the fabrication of a panel, the first plate PLT1 of the first storage capacitor Cst1 and the third plate PLT3 of the second storage capacitor Cst2 may be patterned in positions shifted in the direction opposite to the first direction. In this case, a portion of the first auxiliary pattern AUX1 may not overlap with the first scan line SCL1.

Here, the area size S1 of the first compensation pattern CCP1 may be greater than the area size S4 of the fourth compensation pattern CCP4, and the area size S2 of the second compensation pattern CCP2 may be smaller than the area size S3 of the third compensation pattern CCP3. Thus, even in the case in which the process deviation has occurred, the overlapping area between the first plate PLT1 and the second plate PLT2 can also be maintained the same as before the occurrence of the process deviation, and the overlapping area between the third plate PLT3 and the fourth plate PLT4 can also be maintained the same as before the occurrence of the process deviation. Consequently, even in the case in which the process deviation has occurred, the first storage capacitor Cst1 and the second storage capacitor Cst2 can have the same capacitance.

In addition, in the display device 100 according to the present disclosure, a repair structure suitable for the first subpixel SP1 and the second subpixel SP2 having a flip structure may be disclosed. Hereinafter, the first subpixel SP1 and the second subpixel SP2 having a flip structure will be illustrated as examples in order to describe the repair structure. Herein, subpixel SP having a defect will be referred to as a bad subpixel Bad SP, and a subpixel SP having no defect will be referred to as a normal subpixel Normal SP.

The repair in the display device 100 according to the present disclosure may be a method of normalizing the bad subpixel Bad SP by stopping the operation of the pixel driver circuit SPC of the bad subpixel Bad SP and driving the emitting device ED of the bad subpixel Bad SP using the pixel driver circuit SPC of the normal subpixel Normal SP so that light can be emitted from the bad subpixel Bad SP.

The repair in the display device 100 according to the present disclosure may include cutting repair and welding repair. The cutting repair may be a process of cutting a major point (e.g., a cutting point) in the pixel driver circuit SPC that may stop the operation of the pixel driver circuit SPC of the bad subpixel Bad SP. The welding repair may be a process of welding a major point (e.g., a welding point) by which the pixel driver circuit SPC of the normal subpixel Normal SP and the pixel electrode PE of the emitting device ED may be electrically connected, so that the emitting device ED of the bad subpixel can be driven using the pixel driver circuit SPC of the normal subpixel.

The display device 100 according to the present disclosure has a repair structure by which the bottom repair is enabled. Thus, a decrease in the aperture ratio of each of the first subpixel SP1 and the second subpixel SP2 is not caused.

The repair structure according to a the present disclosure may include a welding repair line WDRL along which welding is performed in the welding repair. The welding repair line WDRL is positioned only adjacent to the boundary line BL between the first subpixel SP1 and the second subpixel SP2. More specifically, one end of the welding repair line WDRL may overlap with a portion of one end of the first pixel electrode PE1 of the first subpixel SP1, and the other end of the welding repair line WDRL may overlap with a portion of one end of the second pixel electrode PE2 of the second subpixel SP2.

Since the welding repair line WDRL is positioned only adjacent to the boundary line BL between the first subpixel SP1 and the second subpixel SP2, a space in which the first pixel driver circuit SPC1 of the first subpixel SP1 is disposed and a space in which the second pixel driver circuit SPC2 of the second subpixel SP2 is disposed are not reduced. That is, the repair structure according to the present disclosure may not cause a decrease in the aperture ratio or an obstacle to high-resolution realization. Hereinafter, the above-described repair structure according to the present disclosure will be described in more detail.

Figure 14:
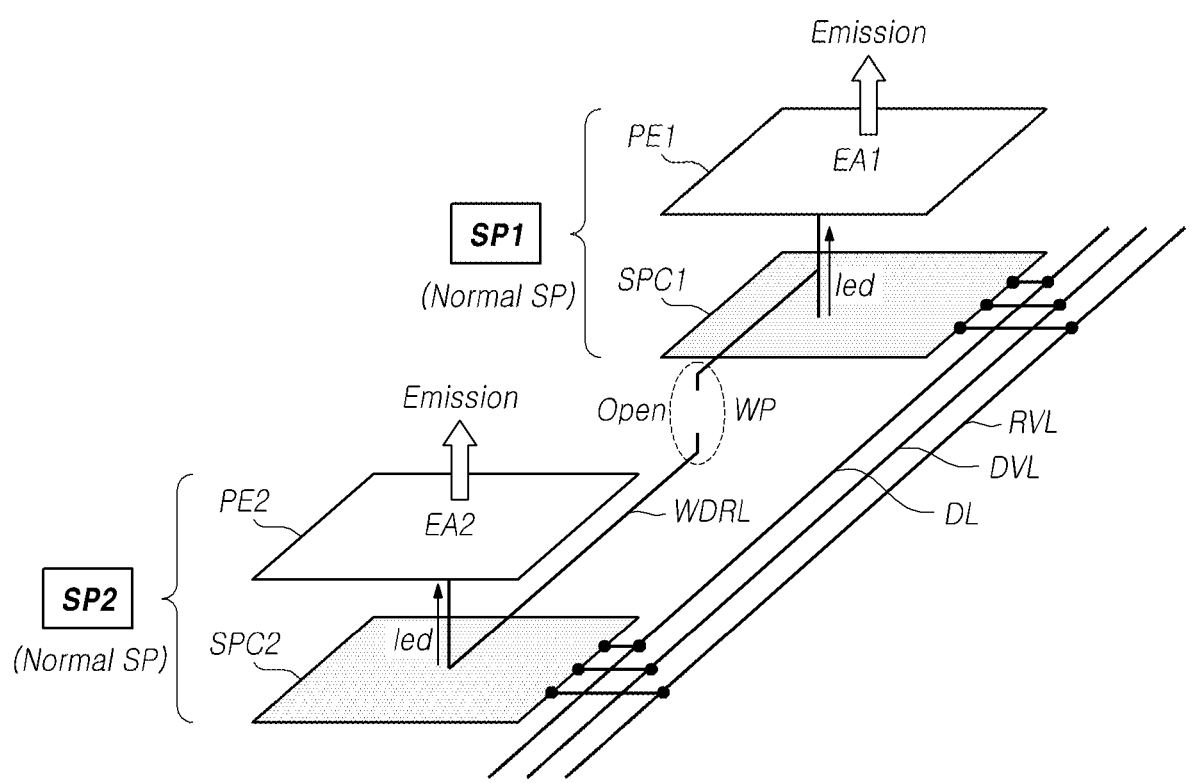
FIGS. 14 and 15 are a schematic diagram and a cross-sectional diagram illustrating the state of the repair structure before the repair processing in the display device according to aspects in a situation in which both the first subpixel and the second subpixel having the flip structure with respect to each other are normal subpixels.
Figure 15:
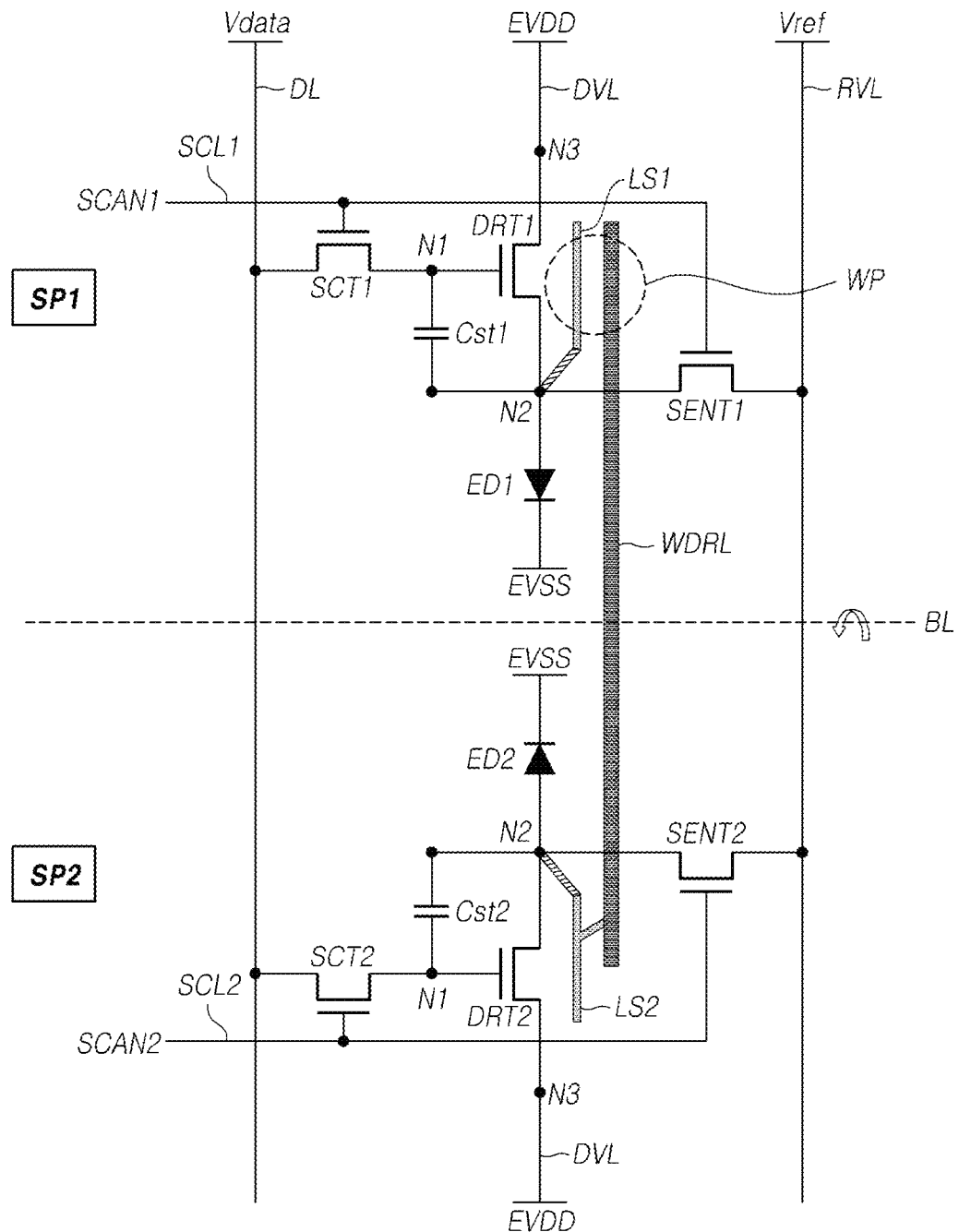

FIGS. 14 and 15 are a schematic diagram and a cross-sectional diagram illustrating the state of the repair structure before the repair processing in the display device 100 according to the present disclosure in a situation in which both the first subpixel SP1 and the second subpixel SP2 having the flip structure with respect to each other are normal subpixels Normal SP.

Referring to FIGS. 14 and 15, the first subpixel SP1 may include the first emitting device ED1 and the first pixel driver circuit SPC1 for driving the first emitting device ED1. The first emitting device ED1 may include the first pixel electrode PE1, and the first pixel driver circuit SPC1 may be connected to the data line DL, the driving voltage line DVL, and the reference voltage line RVL.

Referring to FIGS. 14 and 15, the second subpixel SP2 may include the second emitting device ED2 and the second pixel driver circuit SPC2 for driving the second emitting device ED2. The second emitting device ED2 may include the second pixel electrode PE2, and the second pixel driver circuit SPC2 may be connected to the data line DL, the driving voltage line DVL, and the reference voltage line RVL.

Referring to FIGS. 14 and 15, since both the first subpixel SP1 and the second subpixel SP2 are normal subpixels Normal SP, the welding repair wire WDRL may be connected to only one of the first pixel driver circuit SPC1 and the second pixel driver circuit SPC2. For example, the welding repair wire WDRL may be electrically connected to only the second pixel driver circuit SPC2 of the first pixel driver circuit SPC1 and the second pixel driver circuit SPC2.

Referring to FIGS. 14 and 15, when both the first subpixel SP1 and the second subpixel SP2 are normal subpixels Normal SP, the first emitting device ED1 may be supplied with driving current Ied from the first driving transistor DRT1 of the first pixel driver circuit SPC1, and the second emitting device ED2 may be supplied with driving current Ied from the second driving transistor DRT2 of the second pixel driver circuit SPC2.

Referring to FIGS. 14 and 15, the first subpixel SP1 may include the first emitting device ED1 and the first pixel driver circuit SPC1, and the first pixel driver circuit SPC1 may include the first driving transistor DRT1, the first scan transistor SCT1, and the first storage capacitor Cst1.

Referring to FIGS. 14 and 15, the second subpixel SP2 may include the second emitting device ED2 and the second pixel driver circuit SPC2, and the second pixel driver circuit SPC2 may include the second driving transistor DRT2, the second scan transistor SCT2, and the second storage capacitor Cst2.

Referring to FIGS. 14 and 15, the second subpixel SP2 may be disposed adjacent to the first subpixel SP1 and have the flip structure with respect to the first subpixel SP1. The first driving transistor DRT1 and the second driving transistor DRT2 may be positioned adjacent to each other such that the first subpixel SP1 and the second subpixel SP2 are configured to be inverted with respect to each other and form a repair structure. Thus, the first driving transistor DRT1 and the second driving transistor DRT2 may be positioned between the first scan transistor SCT1 and the second scan transistor SCT2 (shown in FIG. 6).

Referring to FIGS. 14 and 15, a first shield metal LS1 and a second shield metal SL2 may be disposed on or over the substrate SUB. The first shield metal LS1 may be positioned below the first driving transistor DRT1. The second shield metal LS2 may be positioned below the second driving transistor DRT2.

Figure 16:
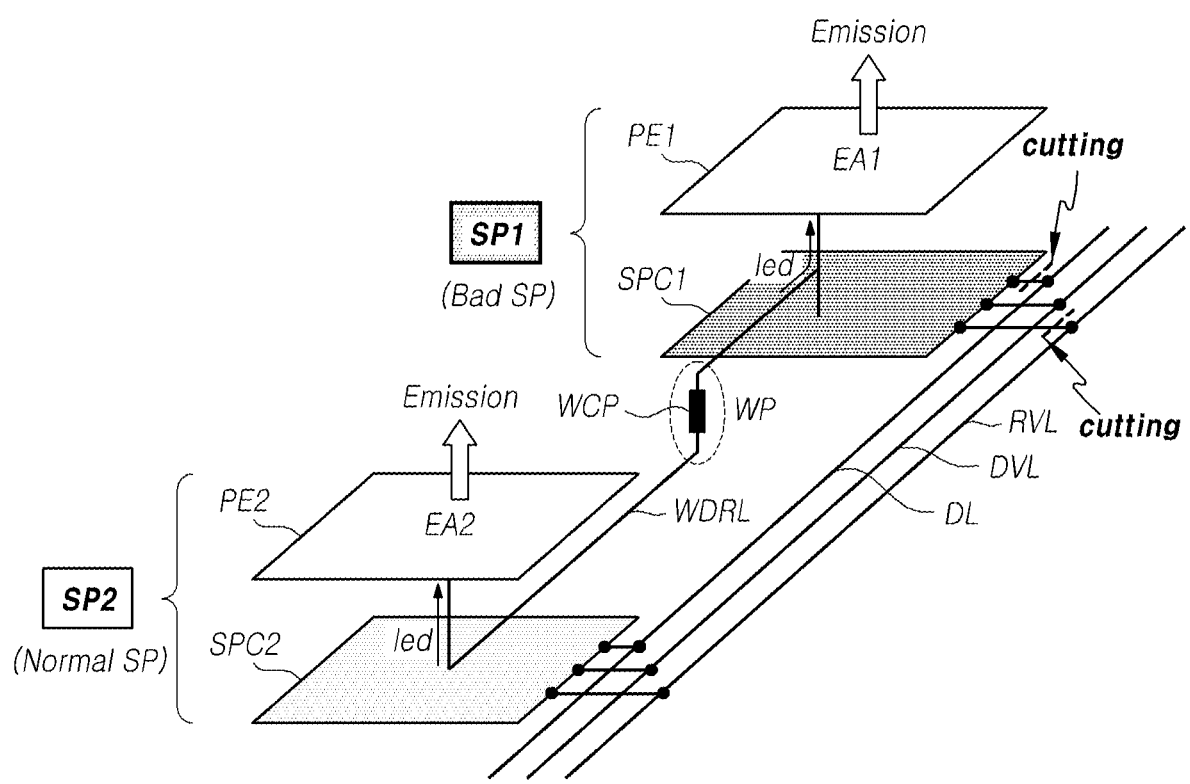
FIGS. 16 and 17 are a schematic diagram and a cross-sectional diagram illustrating the changed state of the repair structure after the repair processing is performed in a situation in which the first subpixel among the first subpixel and the second subpixel having the flip structure with respect to each other is a bad subpixel.
Figure 17:
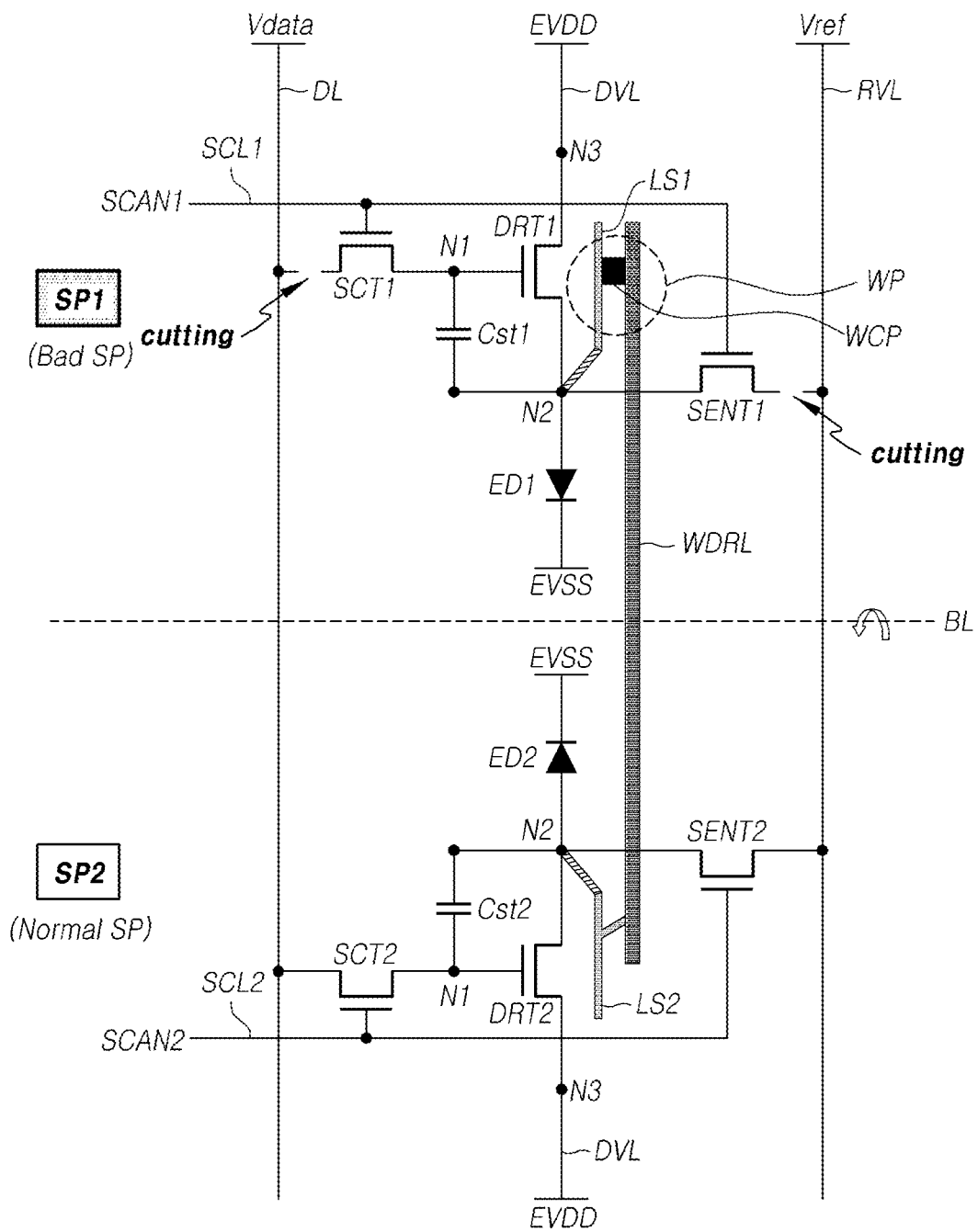

FIGS. 16 and 17 are a schematic diagram and a cross-sectional diagram illustrating the changed state of the repair structure after the repair processing is performed in a situation in which the first subpixel SP1 among the first subpixel SP1 and the second subpixel SP2 having the flip structure with respect to each other is a bad subpixel Bad SP. Thus, hereinafter, the changed state of the repair structure due to the repair processing will mainly be described.

Referring to FIGS. 16 and 17, when the first subpixel SP1 among the first subpixel SP1 and the second subpixel SP2 is a bad subpixel Bad SP, the first emitting device ED1 may be supplied with driving current from the second driving transistor DRT2.

Referring to FIGS. 16 and 17, when the first subpixel SP1 among the first subpixel SP1 and the second subpixel SP2 is a bad subpixel Bad SP, the welding repair wire WDRL may be electrically connected to the first shield metal LS1.

Referring to FIGS. 16 and 17, when the first subpixel SP1 among the first subpixel SP1 and the second subpixel SP2 is a bad subpixel Bad SP, the drain node or the source node of the first scan transistor SCT1 may be electrically disconnected from the data line DL electrically connected to the drain node or the source node of the second scan transistor SCT2.

Referring to FIGS. 16 and 17, when the first subpixel SP1 among the first subpixel SP1 and the second subpixel SP2 is a bad subpixel Bad SP, the drain node or the source node of the first sensing transistor SENT1 may be electrically disconnected from the reference voltage line RVL electrically connected to the drain node or the source node of the second sensing transistor SENT2.

Referring to FIGS. 16 and 17, due to the welding repair, the first portion PART1 of the welding repair wire WDRL interposed between the first shield metal LS1 and the first source electrode SE1 may be electrically connected to the first shield metal LS1. Due to the welding repair, a welding connection pattern WCP may be formed between the first portion PART1 of the welding repair wire WDRL and the first shield metal LS1.

The above description has been presented to enable any person skilled in the art to make and use the technical idea of the present disclosure, and has been provided in the context of a particular application and its requirements. Various modifications, additions and substitutions to the described the present disclosure will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects of the present disclosure shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device comprising:
    a substrate;
    a plurality of data lines disposed over the substrate in a first direction;
    a first scan line extending through a first subpixel among a plurality of subpixels and disposed in a second direction intersecting the first direction;
    a first auxiliary pattern disposed in an area of the first subpixel in the second direction and electrically connected to the first scan line through one or more first contact holes; and
    an interlayer insulating film positioned between the first scan line and the first auxiliary pattern and having the one or more first contact holes,
    wherein the first scan line comprises a first line portion having a first width in the first direction and a first contact portion having a second width in the first direction, the second width being wider than the first width,
    the first auxiliary pattern comprises a first line pattern portion having a third width in the first direction and a first seating pattern portion having a fourth width in the first direction, the fourth width being wider than the third width,
    the first contact portion of the first scan line is connected to the first seating pattern portion of the first auxiliary pattern through the one or more first contact holes,
    the first contact portion of the first scan line is symmetrical with respect to a central axis of the first line portion of the first scan line in the second direction, and
    the first seating pattern portion of the first auxiliary pattern is symmetrical with respect to a central axis of the first line pattern portion in the second direction.

2. The display device of claim 1, wherein the first width matches the third width, and the second width matches the fourth width.

3. The display device of claim 1, wherein the first scan line is configured such that a length by which the first contact portion protrudes from the first line portion in the first direction is the same as a length by which the first contact portion protrudes from the first line portion in a direction opposite to the first direction.

4. The display device of claim 1, wherein the first auxiliary pattern is configured such that a length by which the first seating pattern portion protrudes from the first line pattern portion in the first direction is the same as a length by which the first seating pattern portion protrudes from the first line pattern portion in a direction opposite to the first direction.

5. The display device of claim 1, wherein the first scan line and the first auxiliary pattern intersect an active layer of a first scan transistor included in the first subpixel, and
    wherein the first scan transistor has a gate node receiving a first scan signal from the first scan line.

6. The display device of claim 1, wherein an entirety of the first auxiliary pattern overlaps with the first scan line, and the first seating pattern portion of the first auxiliary pattern includes all of the one or more first contact holes.

7. The display device of claim 1, wherein a portion of the first auxiliary pattern does not overlap with the first scan line, and the first seating pattern portion of the first auxiliary pattern includes all of the one or more first contact holes.

8. The display device of claim 1, further comprising:
    a second scan line disposed in the second direction and adjacent to the first scan line in the first direction; and
    a second auxiliary pattern disposed in the second direction in an area of a second subpixel among the plurality of subpixels adjacent to the first subpixel in the first direction and electrically connected to the second scan line through one or more second contact holes,
    wherein the interlayer insulating film is positioned between the second scan line and the second auxiliary pattern,
    the second scan line comprises a second line portion having the first width in the first direction and a second contact portion having the second width in the first direction,
    the second auxiliary pattern comprises a second line pattern portion having the third width in the first direction and a second seating pattern portion having the fourth width in the first direction,
    the second contact portion of the second scan line is connected to the second seating pattern portion of the first auxiliary pattern through the one or more second contact holes,
    the second contact portion of the second scan line is symmetrical with respect to a central line of the second line portion of the second scan line in the second direction, and
    the second seating pattern portion of the second auxiliary pattern is symmetrical with respect to a central line of the second line pattern portion of the second auxiliary pattern in the second direction.

9. The display device of claim 8, wherein the first subpixel comprises a first scan transistor, and the second subpixel comprises a second scan transistor, and
    wherein the first scan transistor and the second scan transistor are disposed to be symmetrical with each other with respect to a boundary line between the first subpixel and the second subpixel.

10. The display device of claim 9, wherein, when a portion of the first auxiliary pattern does not overlap with the first scan line, a portion of the second auxiliary pattern does not overlap with the second scan line, and
    wherein the first seating pattern portion of the first auxiliary pattern is disposed to include all of the one or more first contact holes, and the second seating pattern portion of the second auxiliary pattern includes all of the one or more second contact holes.

11. The display device of claim 10, wherein the area size of the portion of the first auxiliary pattern not overlapping with the first scan line is the same as the area size of the portion of the second auxiliary pattern not overlapping with the second scan line.

12. The display device of claim 9, wherein the first subpixel further comprises a first storage capacitor including a first plate and a second plate, and
the first plate comprising a first compensation pattern extending in the direction opposite to the first direction so as to not overlap with the second plate and a second compensation pattern extending in the first direction so as to not overlap with the second plate, and
the second subpixel further comprises second storage capacitor comprising a third plate and a fourth plate,
the third plate comprising a third compensation pattern extending in the direction opposite to the first direction so as to not overlap with the fourth plate and a fourth compensation pattern extending in the first direction so as to not overlap with the fourth plate.

13. The display device of claim 12, wherein the first storage capacitor and the second storage capacitor have a shape symmetrical with each other with respect to a boundary line between the first subpixel and the second subpixel.

14. The display device of claim 12, wherein the width of the first compensation pattern is the same as the width of the second compensation pattern, and the width of the third compensation pattern is the same as the width of the fourth compensation pattern.

15. The display device of claim 12, wherein, when an entirety of the first auxiliary pattern overlaps with the first scan line,
the area size of the first compensation pattern is the same as the area size of the fourth compensation pattern, and
the area size of the second compensation pattern is the same as the area size of the third compensation pattern, and
the first storage capacitor and the second storage capacitor have a same capacitance.

16. The display device of claim 12, wherein, when a portion of the first auxiliary pattern does not overlap with the first scan line,
the area size of the first compensation pattern is greater than the area size of the fourth compensation pattern,
the area size of the second compensation pattern is smaller than the area size of the third compensation pattern, and
the first storage capacitor and the second storage capacitor have the same capacitance.

17. The display device of claim 12, wherein, when a portion of the first auxiliary pattern does not overlap with the first scan line,
the area size of the first compensation pattern is smaller than the area size of the fourth compensation pattern,
the area size of the second compensation pattern is greater than the area size of the third compensation pattern, and
the first storage capacitor and the second storage capacitor have the same capacitance.

18. A display device comprising:
a substrate;
a first scan line disposed on the substrate and extending through a first subpixel among a plurality of subpixels;
a first auxiliary pattern disposed in an area of the first subpixel and electrically connected to the first scan line through one or more first contact holes; and
an interlayer insulating film positioned between the first scan line and the first auxiliary pattern and having the one or more first contact holes,
wherein the first scan line protrudes in a top-bottom direction to be symmetrical with respect to a longitudinal axis, and
the first auxiliary pattern protrudes in the top-bottom direction to be symmetrical with respect to a longitudinal axis.

19. The display device of claim 18, wherein a line area including portions protruding from the first scan line in the top-bottom direction and a line area including portions protruding from the first auxiliary pattern in the top-bottom direction are connected with each other through the one or more first contact holes.

20. The display device of claim 19, wherein a portion of the line area including the portions protruding from the first scan line in the top-bottom direction does not overlap with the line area including the portions protruding from the first auxiliary pattern in the top-bottom direction.

* * * * *